United States Patent
Yaegashi

(10) Patent No.: US 7,122,869 B2
(45) Date of Patent: Oct. 17, 2006

(54) NONVOLATILE SEMICONDUCTOR MEMORY DEVICE IN WHICH SELECTION TRANSISTORS AND MEMORY TRANSISTORS HAVE DIFFERENT IMPURITY CONCENTRATION DISTRIBUTIONS

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/225,094

(22) Filed: Sep. 14, 2005

(65) Prior Publication Data

US 2006/0011991 A1    Jan. 19, 2006

Related U.S. Application Data

(62) Division of application No. 10/942,013, filed on Sep. 16, 2004, now Pat. No. 6,949,794, which is a division of application No. 10/058,343, filed on Jan. 30, 2002, now Pat. No. 6,835,987.

(30) Foreign Application Priority Data

Jan. 31, 2001  (JP)  ............................. 2001-023973
Mar. 23, 2001  (JP)  ............................. 2001-085821

(51) Int. Cl.
     *H01L 29/76* (2006.01)
(52) U.S. Cl. ................ 257/391; 257/392; 257/E27.107
(58) Field of Classification Search ................ 257/326, 257/390–392, 402–407, E21.107
     See application file for complete search history.

(56) References Cited

U.S. PATENT DOCUMENTS

| 5,293,337 | A | * | 3/1994 | Aritome et al. | ........ 365/185.17 |
| 5,949,101 | A | * | 9/1999 | Aritome | ..................... 257/315 |
| 6,072,721 | A | * | 6/2000 | Arase | ..................... 365/185.11 |
| 6,835,978 | B1 | | 12/2004 | Matsui et al. | |
| 6,853,029 | B1 | | 2/2005 | Ichige et al. | |

FOREIGN PATENT DOCUMENTS

| JP | 10-209405 | 8/1998 |
| JP | 10-214494 | 8/1998 |
| JP | 11-67938 | 3/1999 |
| JP | 11-224909 | 8/1999 |
| JP | 2000-68487 | 3/2000 |

* cited by examiner

*Primary Examiner*—Marcos Pizarro
(74) *Attorney, Agent, or Firm*—Oblon, Spivak, McClelland, Maier & Neustadt, P.C.

(57) ABSTRACT

A non-volatile semiconductor memory device is disclosed, which comprises a memory cell unit including at least one memory cell transistor formed on a semiconductor substrate and having a laminated structure of a charge accumulation layer and a control gate layer, and a selection gate transistor one of the source/drain diffusion layer regions of which is connected to a bit line or a source line and the other of the the source/drain diffusion layer regions of which is connected to the memory cell unit. The shape of the source diffusion layer region of the selection gate transistor is asymmetical to the shape of the drain diffusion layer region thereof below the selection gate transistor.

6 Claims, 28 Drawing Sheets

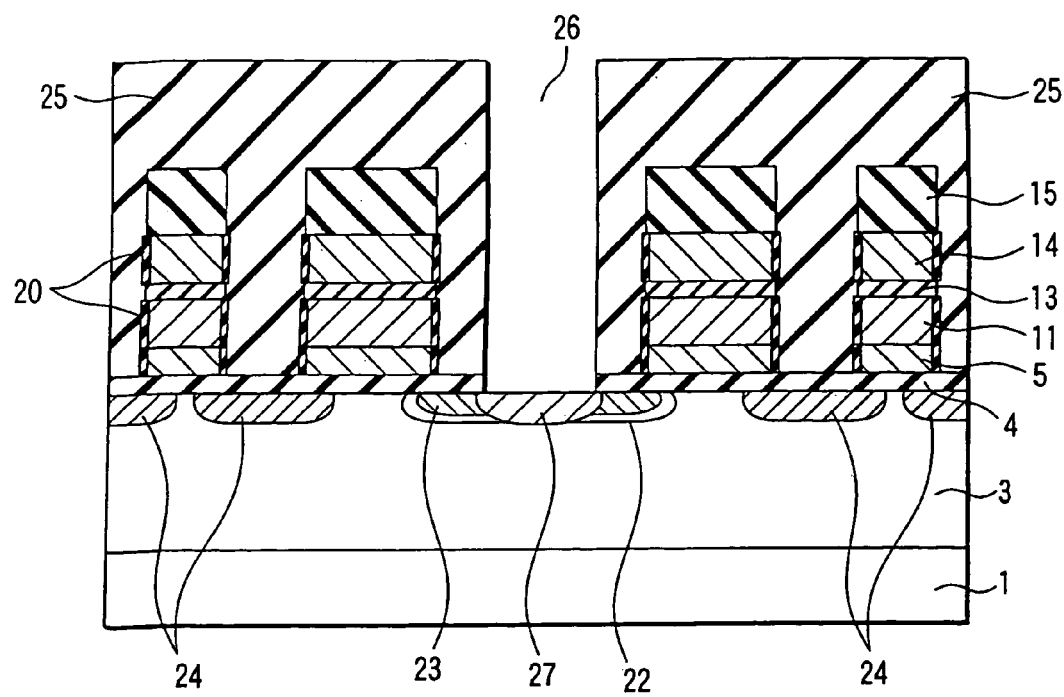
F I G. 17
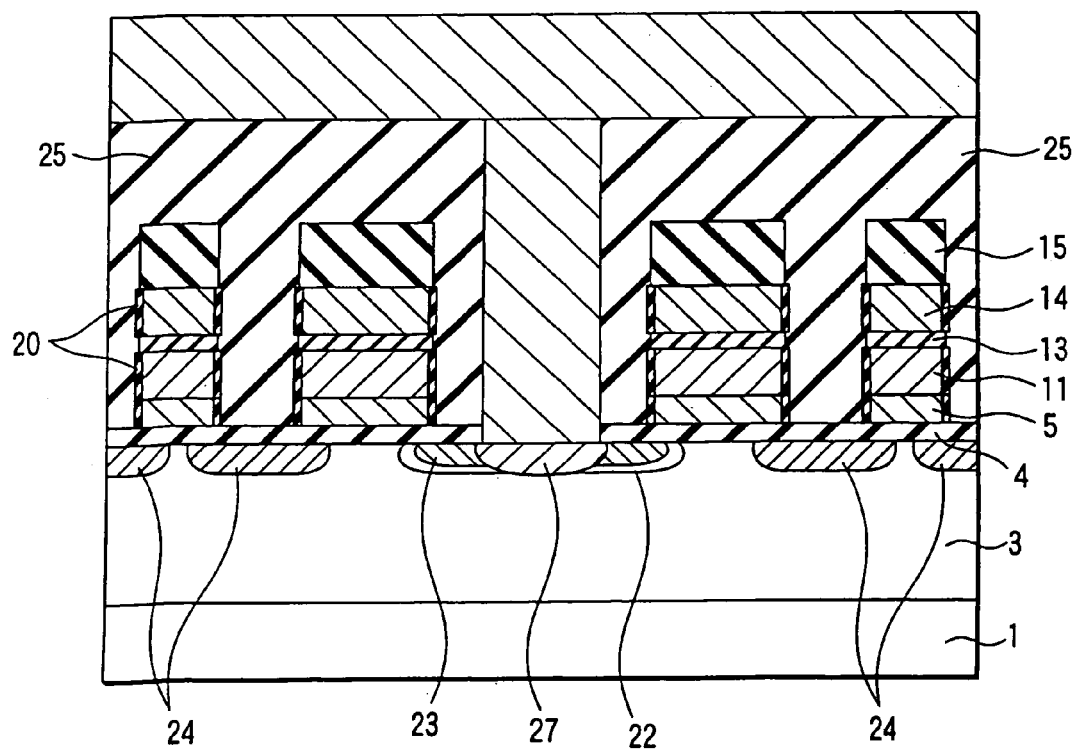
F I G. 18

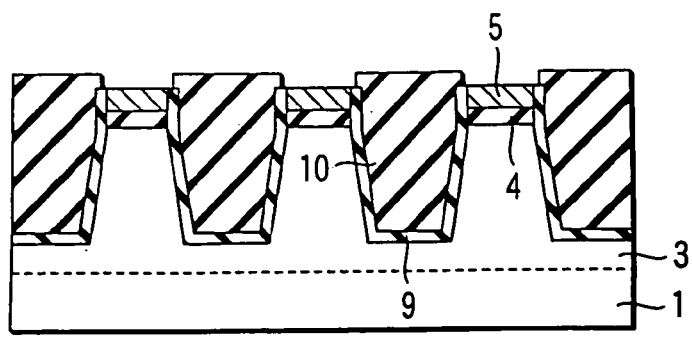
F I G. 31
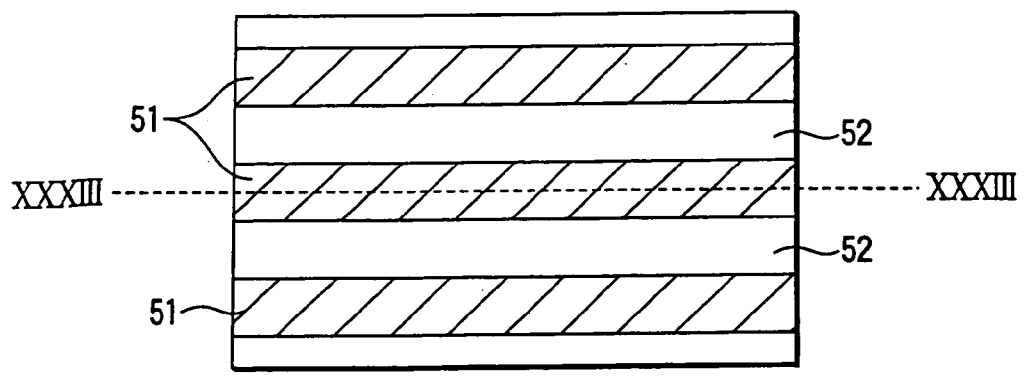
F I G. 32
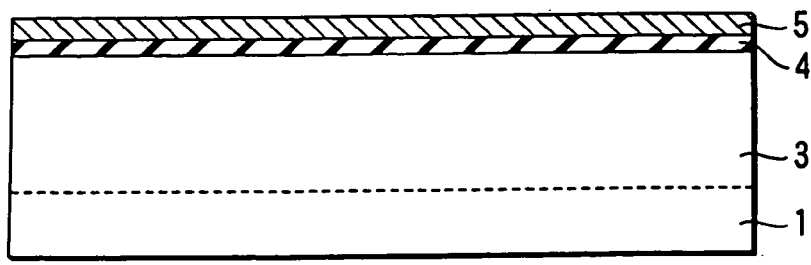
F I G. 33

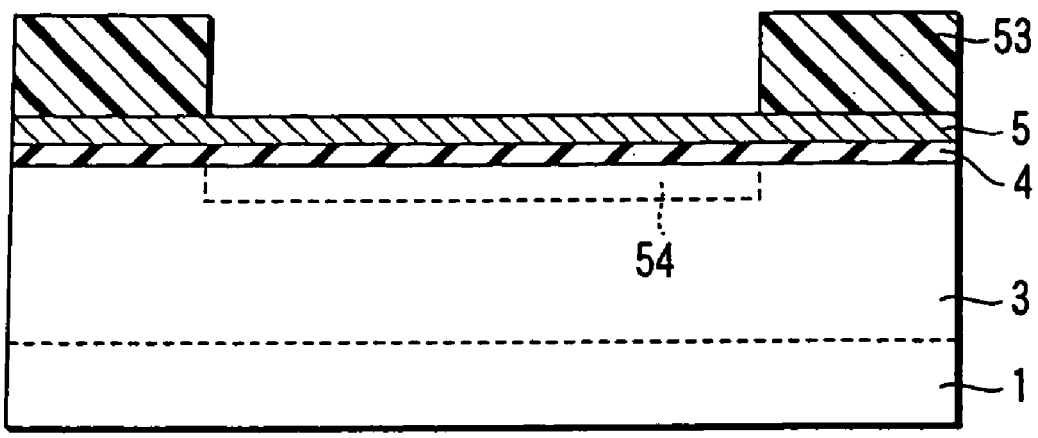
F I G. 34
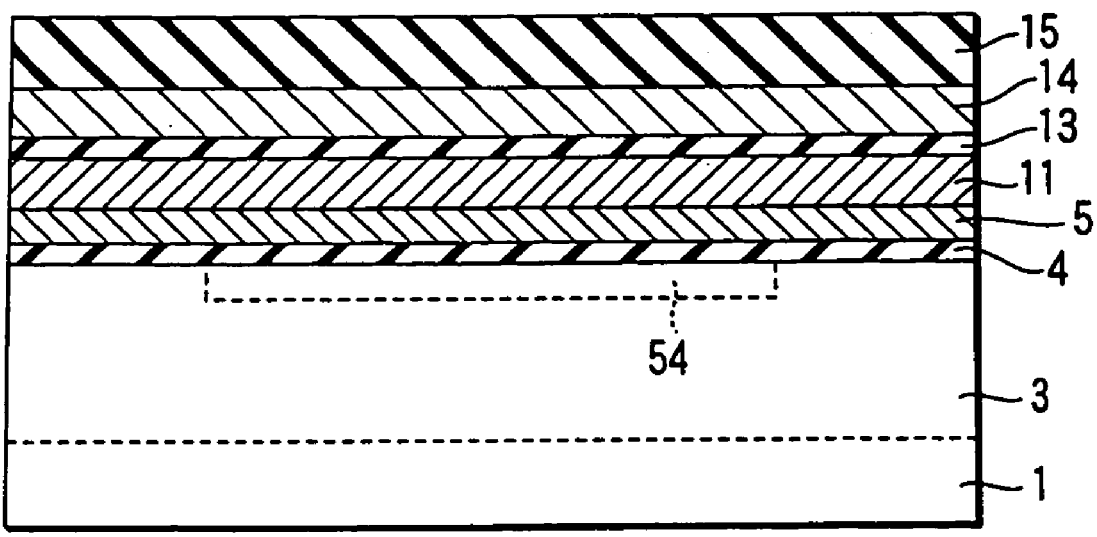
F I G. 35

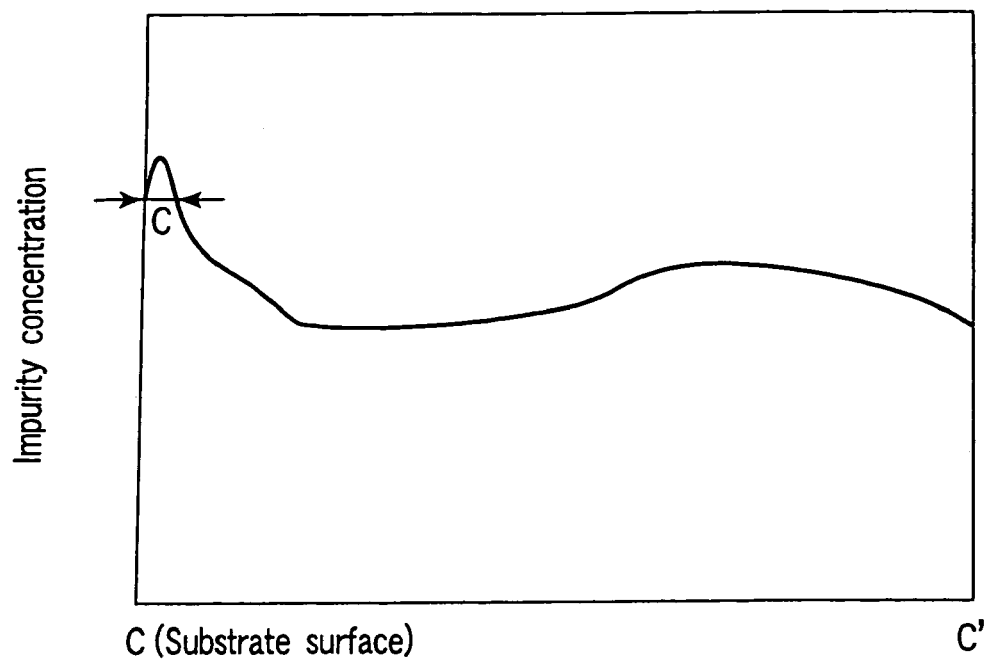
F I G. 40
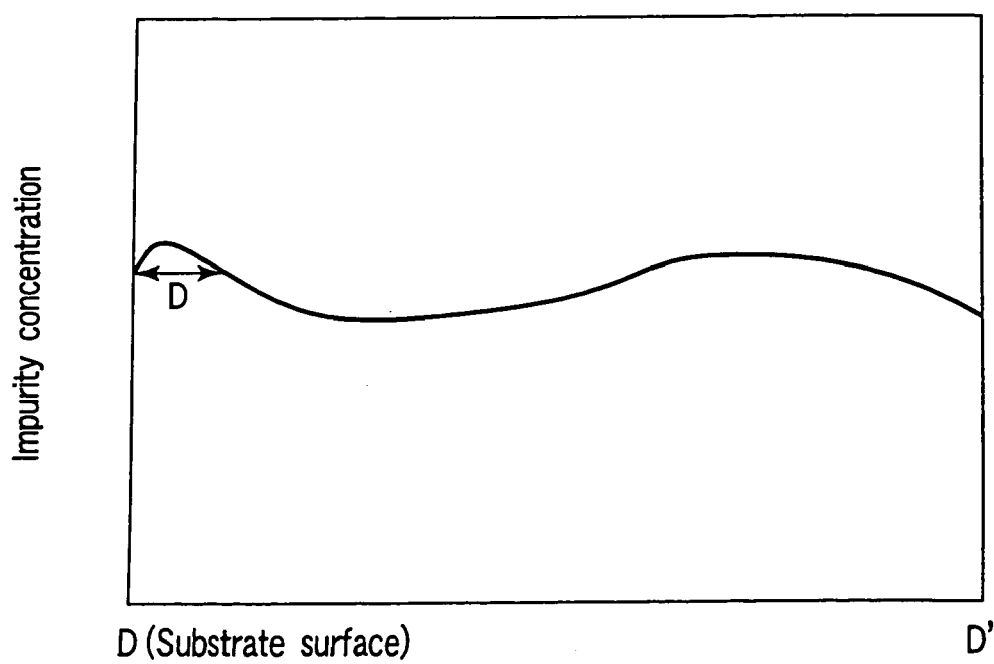
F I G. 41

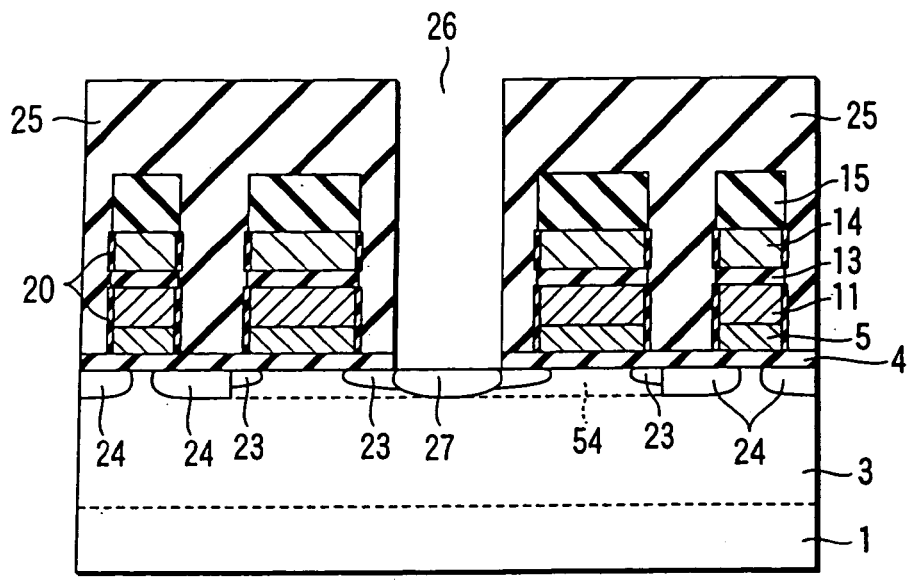
F I G. 42
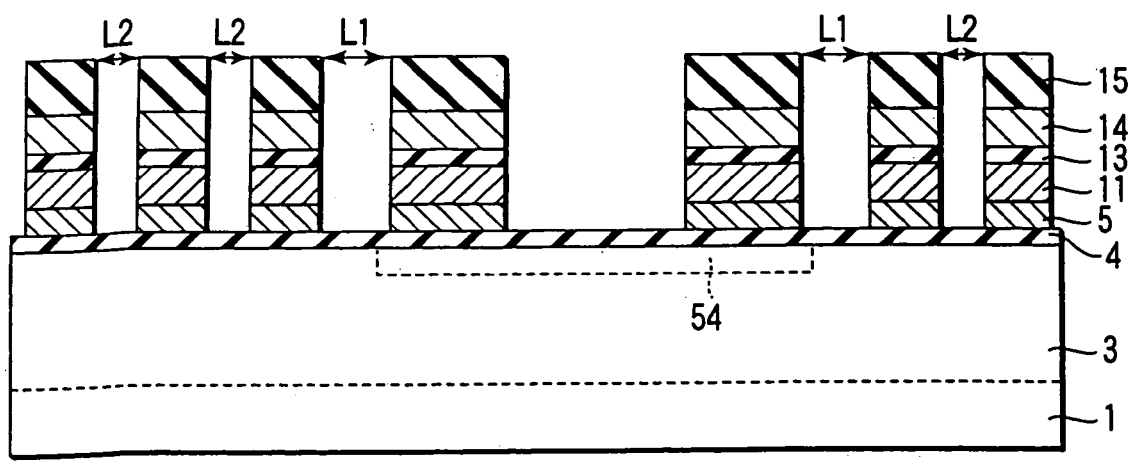
F I G. 43

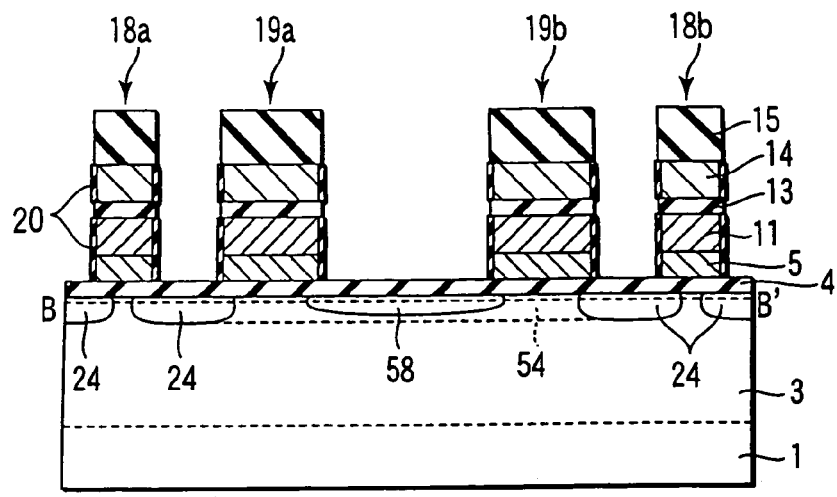
F I G. 46
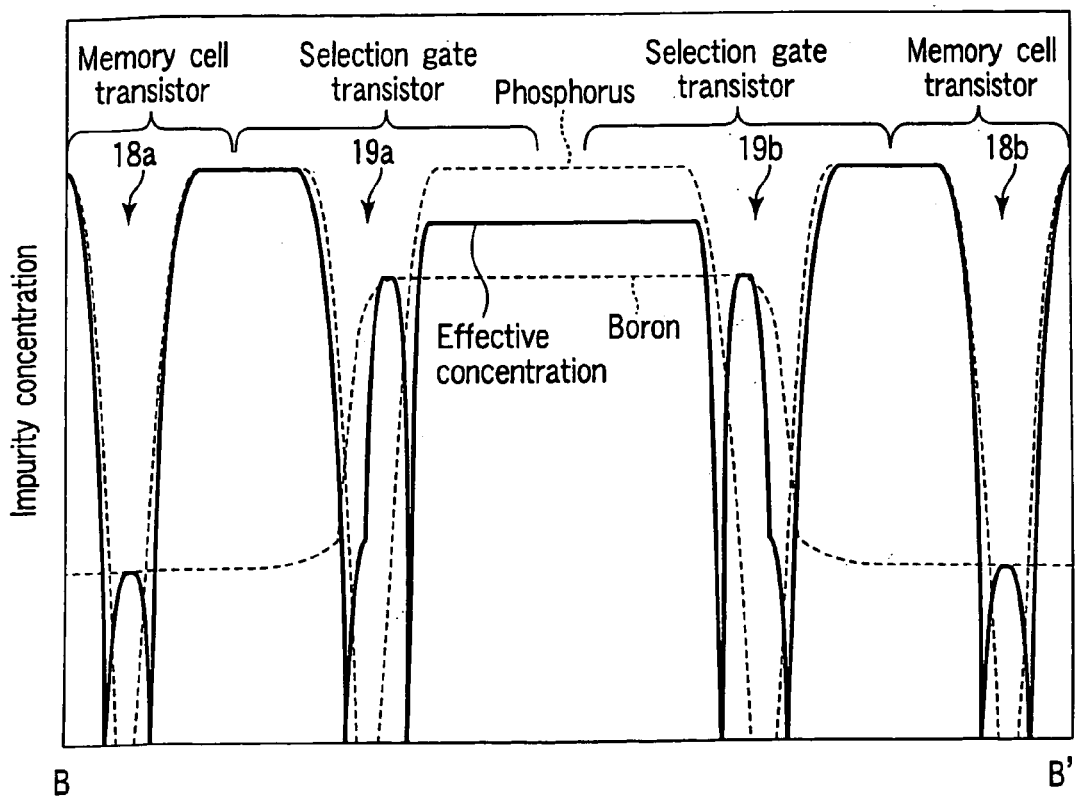
F I G. 47

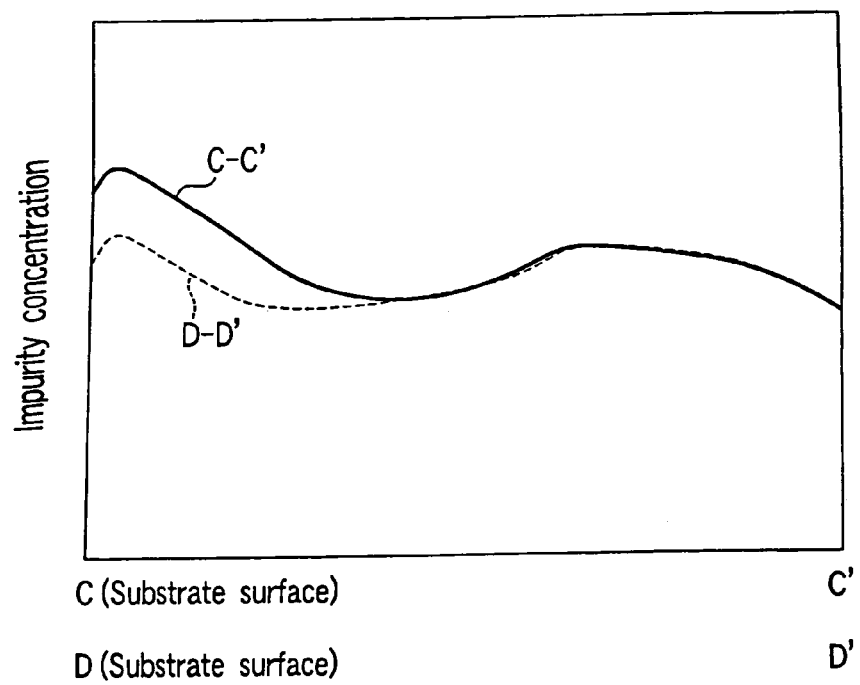
F I G. 56

NONVOLATILE SEMICONDUCTOR MEMORY DEVICE IN WHICH SELECTION TRANSISTORS AND MEMORY TRANSISTORS HAVE DIFFERENT IMPURITY CONCENTRATION DISTRIBUTIONS

CROSS-REFERENCE TO RELATED APPLICATIONS

This application is a divisional of and claims priority under 35 U.S.C. § 120 to U.S. application Ser. No. 10/942,013 now U.S. Pat. No. 6,949,794, filed Sep. 16, 2004, which was a divisional of U.S. application Ser. No. 10/058,343, filed Jan. 30, 2002, now U.S. Pat. No. 6,835,987. This application is based upon and claims the benefit of priority under 35 U.S.C. § 119 from the prior Japanese Patent Applications No. 2001-023973, filed Jan. 21, 2001; and No. 2001-085821, filed Mar. 23, 2001, the entire contents of each of which are incorporated herein by reference.

BACKGROUND OF THE INVENTION

1. Field of the Invention

The present invention relates to a non-volatile semiconductor memory device, and particularly to a selection gate transistor in a memory cell portion which is, for example, applied to a NAND type flash memory.

2. Description of the Related Art

FIG. 57 shows a sectional view of memory cell transistors and selection gate transistors taken in a gate length "L" direction in a conventional NAND type semiconductor memory device.

A contact hole 34 is formed between the gate electrodes of the selection gate transistors in self-alignment with respect to these gate electrodes. A TEOS film 29 is deposited on the gate sidewalls of the memory cell transistors to improve hot carrier characteristics.

On the other hand, the selection gate transistors are arranged such that the TEOS film 29 of the gate sidewalls thereof is removed before the contact hole 34 is opened to prevent the short-circuit between a contact filling material and the gate electrodes because the TEOS film 29 is etched when the contact hole 34 is opened. Since an impurity is simultaneously ion-implanted in the channel regions and source/drain diffusion layer regions 28 of the memory cell transistors and the selection gate transistors, the impurity distribution in the channel regions and the source/drain diffusion layer regions 28 is similar in the memory cell transistors and the selection gate transistors.

In the NAND type semiconductor memory device, when data "1" is written to a memory cell (i.e. when electrons are not implanted in floating gates and a threshold value in erasing is maintained), the electrons are prevented from being implanted in the floating gates 5 and 11 by charging an initial potential from a bit line through the selection gate transistor connected to the memory cell transistor, applying a writing voltage to a selected word line and applying a transfer voltage to non-selected word lines, and increasing the potential of the channel region of the memory cell transistor making use of capacitance coupling. As a result, the capacitance of the channel region is reduced by decreasing the concentration of the impurity therein so that the potential of the channel region is liable to increase, which improves data "1" writing characteristics.

However, there are such circumstances that the nonvolatile semiconductor memory device cannot be normally operated by a decrease in the threshold voltage of the selection gate transistors and an increase in the off-leak current thereof which are caused when the concentration of the impurity in the channel regions is reduced. This is because that the distribution of the impurity in the channel regions of the memory cell transistors is the same as that of the impurity in the channel regions of the selection gate transistors.

FIG. 58 shows a sectional view of a part of manufacturing processes of a memory cell and a selection gate transistor of a conventional NAND type flash memory taken along the gate length direction thereof.

In the figure, reference numeral 1 denotes a silicon substrate and reference numeral 3 denotes a well/channel region. The memory cell and selection gate transistor are simultaneously subjected to impurity ion implantation into the well/channel region 3 and formation of a gate insulation film 4.

The memory cell of the NAND memory cell unit has a gate structure where a charge accumulation layer (floating gate) and a control gate layer are stacked one atop the other via an ONO film 13 on a substrate. The floating gate comprises a first layer of polysilicon 5 and a second layer as a floating gate layer 11 which are deposited in layers. The control gate layer 14 is formed of a polysilicon/WSi laminated film. Here, indicated by reference numeral 15 is a silicon nitride film and 20 is a silicon oxide film. Gate electrodes of the selection gate transistor are designated by reference numerals 5 and 11. Reference numeral 28 denotes a source/drain diffusion layer of the memory cell and selection gate transistor. A contact hole is to be formed between the gate electrodes of the selection gate transistor.

Impurity ion implantation for forming the source/drain diffusion layer 28 of the memory cell and selection gate transistor is carried out simultaneously, and the source/drain diffusion layer 28 of the selection gate transistor is connected to the memory cell unit at one end and is electrically connected to a bit line or source line through the contact hole at the other end.

FIG. 59 shows a concentration distribution of a p-type impurity in a substrate depth direction at a channel region of the selection gate transistor along the line C–C' shown in FIG. 58 and a concentration distribution of a p-type impurity in the substrate depth direction at a channel region of the memory cell along the line D–D' shown in FIG. 58.

As mentioned above, since an impurity is implanted simultaneously into the channel regions of the memory cell and selection gate transistor, the impurity distributions of the both channel regions become the same as shown in FIG. 59.

It is known that a NAND type flash memory is adapted to prevent the data of an unselected block being read out at a time of data reading by turning off the selection gate transistor. For this purpose, in order to allow a threshold voltage of the selection gate transistor to satisfy the limitations of the cut-off characteristics, it is necessary to control the impurity concentrations in the channel regions.

The NAND type flash memory, on the other hand, is adapted to prevent electrons to be introduced into the floating gates 5 and 11 when "1" data is written to the memory cell (i.e. when a threshold value during an erased state is maintained without implanting electrons into the floating gate), by charging the memory cell to the initial potential through the bit line via the selection gate transistor connected to the memory cell, applying a write voltage and a transfer voltage to a selected word line and an unselected word line, respectively, and rising the potential of the channel region of the memory cell by means of capacitive coupling. Thus, decreasing each impurity concentrations of the respective channel regions reduces the channel capacity, which facilitates a rise in potential in the channel region and improves the "1" data writing efficiency.

Conventionally, however, since the impurity distributions of the channel regions of the memory cell and selection gate transistor are the same as stated above, when decreasing the impurity distribution in the channel regions in order to improve the "1" data writing efficiency as mentioned before, a trade-off relationship arises in which the threshold voltage of the selection gate transistor decreases and an off-leak current increases.

BRIEF SUMMARY OF THE INVENTION

According to an aspect of the present invetnion, there is provided a non-volatile semiconductor memory device, comprising:

a memory cell unit including at least one memory cell transistor formed on a semiconductor substrate and having a laminated structure of a charge accumulation layer and a control gate layer; and a selection gate transistor one of the source/drain diffusion layer regions of which is connected to a bit line or a source line and the other of the the source/drain diffusion layer regions of which is connected to the memory cell unit, wherein the shape of the source diffusion layer region of the selection gate transistor is asymmetrical to the shape of the drain diffusion layer region thereof below the selection gate transistor.

According to another aspect of the present invetnion, there is provided a non-volatile semiconductor memory device, comprising:

a memory cell unit including at least one memory cell transistor formed on a semiconductor substrate and having a laminated structure of a charge accumulation layer and a control gate layer; and a selection gate transistor one of the source/drain diffusion layer regions of which is connected to a bit line or a source line and the other of the source/drain diffusion layer regions of which is connected to the memory cell unit, wherein the channel region between the source diffusion layer region of the selection gate transistor and the drain diffusion layer region thererof includes a region having a different concentration of impurity at the positions thereof which have the same depth from the boundary between the semiconductor substrate and a gate insulation film.

According to a further aspect of the present invetnion, there is provided a method of manufacturing a non-volatile semiconductor memory device, comprising:

a step of forming gate electrodes of a memory cell transistor and a selection gate transistor having a first conductive type channel region on a semiconductor substrate;

a step of forming a mask having an aperture on the side of the gate electrode of the selection gate transistor opposite to the side thereof facing the memory cell transistor; and a step of implanting a first conductive type impurity in the semiconductor substrate through the aperture of the mask.

According to a further aspect of the present invetnion, there is provided a method of manufacturing a non-volatile semiconductor memory device, comprising:

a step of forming gate electrodes of a memory cell transistor and a selection gate transistor having a first conductive type channel region on a semiconductor substrate;

a step of forming a first insulation film on the sidewalls of the gate electrodes of the memory cell transistor and the selection gate transistor;

a step of forming a second insulation film on the first insulation film;

a step of forming a mask having an aperture on the side of the gate electrode of the selection gate transistor opposite to the side thereof facing the memory cell transistor;

a step of removing the second insulation film through the aperture of the mask; and a step of implanting a first conductive type impurity in the semiconductor substrate through the aperture of the mask.

According to a further aspect of the present invetnion, there is provided a method of manufacturing a non-volatile semiconductor memory device, comprising:

a step of forming gate electrodes of a memory cell transistor and a selection gate transistor having a first conductive type channel region on a semiconductor substrate;

a step of opening a contact hole through the source/drain diffusion layer region of the selection gate transistor in self-alignment with respect to the gate electrode of the selection gate transistor; and a step of implanting a first conductive type impurity in the semiconductor substrate through the contact hole.

According to a further aspect of the present invetnion, there is provided a method of manufacturing a non-volatile semiconductor memory device, comprising:

a step of forming gate electrodes of a memory cell transistor and selection gate transistors having a first conductive type channel region on a semiconductor substrate in such a manner that the space between the gate electrodes of the selection gate transistors is set larger than the space between the gate electrode of the memory cell transistor and the gate electrode of a selection gate transistor; and a step of implanting a first conductive type impurity in the semiconductor substrate at such an angle that the impurity is not implanted between the gate electrode of the memory cell transistor and the gate electrode of the selection gate transistor and is implanted between the gate electrodes of the selection gate transistors.

According to a further aspect of the present invetnion, there is provided a non-volatile semiconductor memory device, comprising:

a plurality of memory cell units comprising at least one memory cell having a laminated gate structure of a charge accumulation layer and a control gate layer formed on a semiconductor substrate through a gate insulation film; and a plurality of selection gate transistors each having a gate electrode formed through the gate insulation film and a source/drain diffusion layer one of which is connected to each memory cell unit and the other of which is electrically connected to a bit line or a source line, wherein the plurality of selection gate transistors include a pair of first selection gate transistors disposed in confrontation with each other across a contact portion connected to the bit line or to the source line and having substantially the same structure; and the channel regions of the pair of selection gate transistors have the same impurity concentration in a gate length direction at a depth equal from the boundary between the semiconductor substrate and the gate insulation film as well as the concentration distribution of impurity in the channel regions of the pair of selection gate transistors is different from that of the channel region of the memory cell.

According to a further aspect of the present invetnion, there is provided a non-volatile semiconductor memory device, comprising:

a plurality of memory cell units comprising at least one memory cell having a laminated gate structure of a charge accumulation layer and a control gate layer formed on a semiconductor substrate through a gate insulation film; and a plurality of selection gate transistors each having a gate electrode formed through a gate insulation film formed of the same layer as the gate insulation film of the memory cell and a source/drain diffusion layer one of which is connected to each memory cell unit and the other of which is electrically connected to a bit line or a source line, wherein the plurality of selection gate transistors have a pair of first selection gate transistors disposed in confrontation with each other across a contact portion connected to the bit line or to the source line and having substantially the same structure; and the effective impurity concentration of the source/drain diffusion layer of the pair of first selection gate transistors is lower than that of the source/drain diffusion layer of the memory cell at a depth equal from the boundary between the semiconductor substrate and the gate insulation film.

According to a further aspect of the present invetnion, there is provided a non-volatile is semiconductor memory device, comprising:

a plurality of memory cell units comprising at least one memory cell having a laminated gate structure of a charge accumulation layer and a control gate layer formed on a semiconductor substrate through a gate insulation film; and a plurality of selection gate transistors each having a gate electrode formed through a gate insulation film formed of the same layer as the gate insulation film of the memory cell and a source/drain diffusion layer one of which is connected to each memory cell unit and the other of which is electrically connected to a bit line or a source line, wherein the plurality of selection gate transistors have first selection gate transistors and second selection gate transistors disposed in confrontation with each other through a contact portion connected to the bit line or the source line, and the structure of the first selection gate transistors is substantially different from that of the second selection gate transistors;

the channel regions of the first selection gate transistors have the same impurity concentration in a gate length direction at a depth equal from the boundary between the semiconductor substrate and the gate insulation film as well as the concentration distribution of impurity of the channel regions of the first selection gate transistors is different from that of the channel region of the memory cell; and each of the second selection gate transistors has a portion in which the impurity concentration of the channel region thereof is different in a gate length direction at the above depth from the boundary between the semiconductor substrate, and the impurity concentration of the portion of the channel region containing a high concentration impurity is the same as that of the channel region of each of the first selection gate transistors at the above depth from the boundary between the semiconductor substrate and the gate insulation film.

According to a further aspect of the present invetnion, there is provided a non-volatile semiconductor memory device, comprising:

a plurality of memory cell units comprising at least one memory cell having a laminated gate structure of a charge accumulation layer and a control gate layer formed on a semiconductor substrate through a gate insulation film; and a plurality of selection gate transistor each having a gate electrode formed through a gate insulation film that is formed simultaneously with the gate insulation film of the memory cell and a source/drain diffusion layer one of which is connected to each memory cell unit and the other of which is electrically connected to a bit line or a source line, wherein the plurality of selection gate transistors have first selection gate transistors and second selection gate transistors disposed in confrontation with each other through a contact portion connected to the bit line or the source line, and the structure of the first selection gate transistors is substantially different from that of the second selection gate transistors;

the impurity concentration of the source diffusion layer of each of the first selection gate transistors is the same as that of the drain diffusion layer thereof at a depth equal from the boundary between the semiconductor substrate and the gate insulation film as well as the effective impurity concentration of the source/drain diffusion layer of each of the first selection gate transistors is lower than that of the source/drain diffusion layer of the memory cell; and the impurity concentration of the source diffusion layer of each of the second selection gate transistors is different from that of the drain diffusion layer thereof at a depth equal from the boundary between the semiconductor substrate and the gate insulation film as well as the impurity concentration of the source diffusion layer or the drain diffusion layer, which is connected to the bit line or the source line, of each of the second selection gate transistors is the same as that of the source/drain diffusion layer of each of the first selection gate transistors.

According to a further aspect of the present invetnion, there is provided a non-volatile semiconductor memory device, comprising:

a plurality of memory cell units comprising at least one memory cell having a laminated gate structure of a charge accumulation layer and a control gate layer formed on a semiconductor substrate through a gate insulation film; and a plurality of selection gate transistor each having a gate electrode formed through a gate insulation film that is formed simultaneously with the gate insulation film of the memory cell and is substantially the same therewith and a source/drain diffusion layer one of which is connected to each memory cell unit and the other of which is electrically connected to a bit line or a source line, wherein the plurality of selection gate transistors have a pair of selection gate transistors disposed in confrontation with each other across a contact portion connected to the bit line or to the source line; and the pair of selection gate transistors have substantially the same structure, each of the pair of transistors has a portion in which the impurity concentration of the channel region thereof is different in a gate length direction at a depth equal from the boundary between the semiconductor substrate and the gate insulation film, and the concentration distribution of impurity of the channel region of each transistor is different from that of the channel region of the memory cell.

According to a further aspect of the present invetnion, there is provided a non-volatile semiconductor memory device, comprising:

a plurality of memory cell units comprising at least one memory cell formed on a semiconductor substrate through a gate insulation film and having a laminated gate structure of a charge accumulation layer and a control gate layer; and a plurality of selection gate transistor each having a gate electrode formed through a gate insulation film that is formed simultaneously with the gate insulation film of the memory cell and is substantially the same therewith and a source/drain diffusion layer one of which is connected to each memory cell unit and the other of which is electrically connected to a bit line or a source line, wherein the plurality of selection gate transistors have a pair of selection gate transistors disposed in confrontation with each other across a contact portion connected to the bit line or to the source line and having substantially the same structure; and the impurity concentration of the source diffusion layer of each of the pair of selection gate transistors is different from that of the drain diffusion layer thereof at a depth equal from the boundary between the semiconductor substrate and the gate insulation film as well as the effective impurity concentration of the source diffusion layer or the drain diffusion layer, which is connected to the bit line or the source line, of each selection gate transistor is lower than that the source/drain diffusion layer of the memory cell.

According to a further aspect of the present invetnion, there is provided a method of manufacturing a non-volatile semiconductor memory device, comprising:

forming the first conductive type channel regions of a memory cell and selection gate transistors on the surface of a semiconductor substrate;

forming an impurity doping mask having apertures corresponding to only the channel regions of the selection gate transistors on the semiconductor substrate; and doping a first conductive type impurity in the semiconductor substrate through the mask.

According to a further aspect of the present invetnion, there is provided a method of manufacturing a non-volatile semiconductor memory device, comprising:

forming first conductive type channel regions of a memory cell and selection gate transistors on the surface of a semiconductor substrate;

forming a gate insulation film on the semiconductor substrate;

forming a part of gate electrodes on the gate insulation film;

forming element isolation regions on the surface layer portion of the semiconductor substrate in self-alignment using the part of gate electrodes as a mask;

forming an impurity doping mask having apertures corresponding to only the channel regions the selection gate transistors on the semiconductor substrate; and doping a first conductive type impurity in the semiconductor substrate via the part of the gate electrodes through the mask.

According to a further aspect of the present invetnion, there is provided a method of manufacturing a non-volatile semiconductor memory device, comprising:

forming first conductive type channel regions of a memory cell and selection gate transistors on the surface of a semiconductor substrate;

forming a gate insulation film on the semiconductor substrate;

forming a part of gate electrodes on the gate insulation film;

forming element isolation regions on the surface layer portion of the semiconductor substrate in self-alignment using the part of the gate electrodes as a mask;

forming an impurity doping mask having apertures corresponding to the channel regions the selection gate transistors and to the element isolation region of a transistor constituting the peripheral circuit of memory cell units; and doping a first conductive type impurity in the semiconductor substrate via the part of the gate electrodes through the mask.

BRIEF DESCRIPTION OF THE SEVERAL VIEWS OF THE DRAWING

FIG. 17 is a sectional view showing a manufacturing process of the non-volatile semiconductor memory device according to the first embodiment of the present invention;

FIG. 18 is a sectional view showing a manufacturing process of the non-volatile semiconductor memory device according to the first embodiment of the present invention;

FIG. 31 is a sectional view showing a manufacturing step following the manufacturing step of FIG. 30;

FIG. 32 is a plan view showing a part of the NAND type flash memory shown in FIG. 31;

FIG. 33 is a sectional view showing the activation region of the NAND type flash memory, taken along the line XXXIII—XXXIII of FIG. 32;

FIG. 34 is a sectional view showing a manufacturing step following the manufacturing step of FIG. 31;

FIG. 35 is a sectional view showing a manufacturing step following the manufacturing step of FIG. 34;

FIG. 40 is a view showing an impurity distribution in the cross-section taken along the line C–C' of FIG. 37;

FIG. 41 is a view showing an impurity distribution in the cross-section taken along the line D–D' of FIG. 37;

FIG. 42 is a sectional view showing a manufacturing step following the manufacturing step of FIG. 37;

FIG. 43 is a sectional view showing the flash memory in a manufacturing step of the fifth embodiment of the present invention;

FIG. 46 is a sectional view showing a step of manufacturing a NAND type flash memory having a two-layer gate structure according to a seventh embodiment of the present invention;

FIG. 47 is a view showing the impurity distribution in the cross-section taken along the line B–B' of FIG. 46;

FIG. 56 is a view showing the impurity distributions in the cross-sections taken along the lines C–C' and D–D' of FIG. 55;

DETAILED DESCRIPTION OF THE INVENTION

Figure 1:
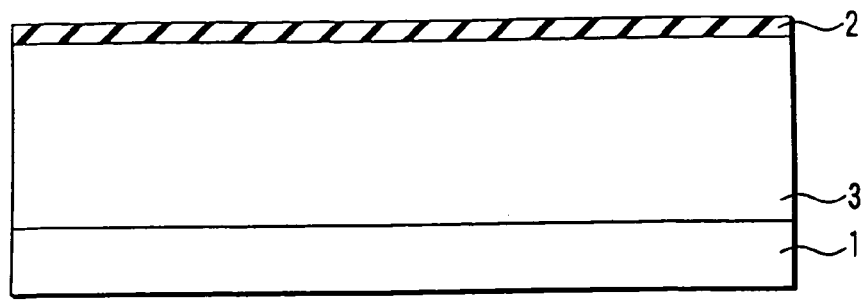
FIG. 1 is a sectional view showing a manufacturing process of a non-volatile semiconductor memory device according to a first embodiment of the present invention.

Embodiments of the present invention will be described below with reference to the drawings. In the following description, corresponding components are denoted by the same reference numerals over the entire figures.

(First Embodiment)

A first embodiment of the present invention is arranged such that the cut-off characteristic of selection gate transistors connected to a memory cell unit are improved by implanting an impurity having the same conductive type as that of channels in the selection gate transistors on the bit line or source line contact sides thereof. A NAND type non-volatile semiconductor memory device according to the first embodiment of the present invention will be described below in detail together with a method of manufacturing the same.

First, a buffer oxide film 2 is formed on the surface of a p-type silicon substrate 1 as shown in FIG. 1. Then, a resist (not shown) is coated and a resist film is formed. Apertures corresponding to a well and a channel region are opened through the resist film by photolithography. Then, an n-type impurity, for example, phosphorus (P) and a p-type impurity, for example, boron (B) are ion-implanted using the resist film as a mask, and n-type well (not shown) and a p-type well/channel region 3 is formed in the p-type silicon substrate 1. Thereafter, the resist film is removed.

Figure 2:
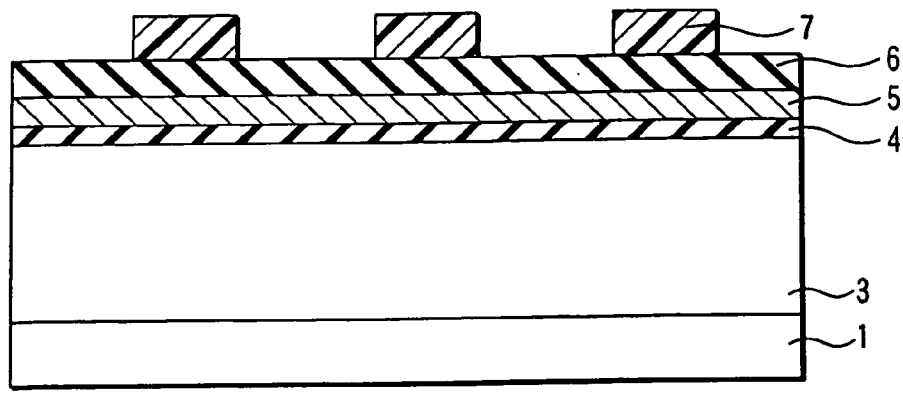
FIG. 2 is a sectional view showing a manufacturing process of the non-volatile semiconductor memory device according to the first embodiment of the present invention.

As shown in FIG. 2, after the buffer oxide film 2 is removed, the gate insulation film 4 of the transistors is formed. Polysilicon, which acts as a part of gate electrodes (floating gates), and silicon nitride, which acts as a mask for STI (shallow trench isolation) processing are deposited, and a polysilicon film 5 and a silicon nitride film 6 are formed. Then, a resist film 7 is formed, and apertures corresponding to element isolation regions 17 are opened through the resist film 7 by photolithography.

Figure 3:
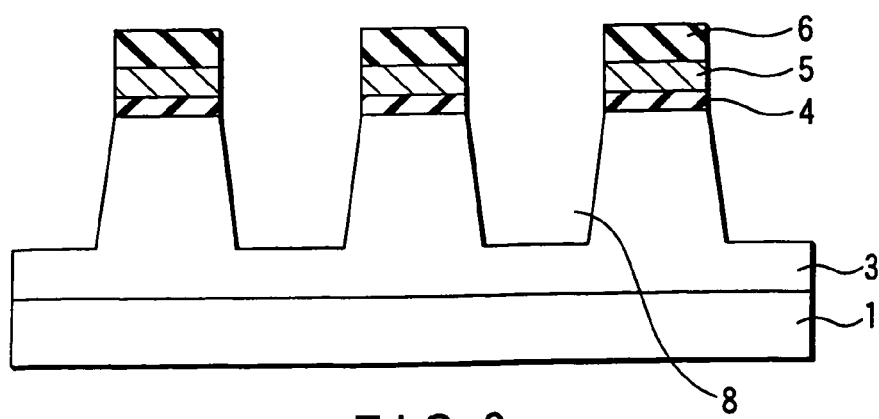
FIG. 3 is a sectional view showing a manufacturing process of the non-volatile semiconductor memory device according to the first embodiment of the present invention.

Thereafter, as shown in FIG. 3, the silicon nitride film 6 is etched using the resist film 7 as a mask. After the resist film 7 is removed, the polysilicon film 5, the gate insulation film 4, and the silicon substrate 1 are sequentially etched using the silicon nitride film 6 as a mask, and STI grooves 8 acting as the element isolation regions 17 are formed.

Figure 4:
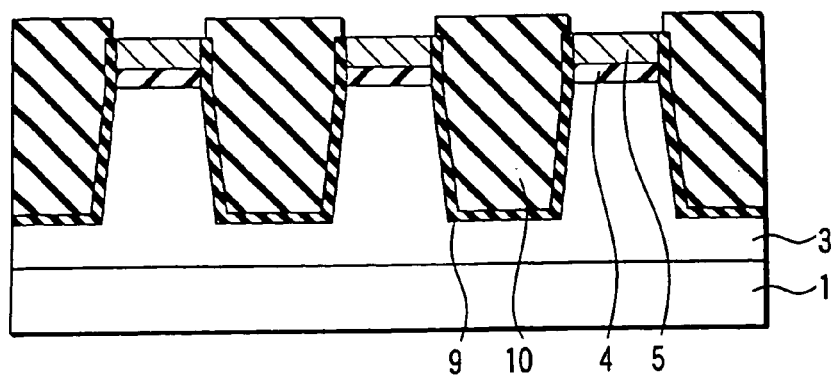
FIG. 4 is a sectional view showing a manufacturing process of the non-volatile semiconductor memory device according to the first embodiment of the present invention.

As shown in FIG. 4, thin silicon oxide films 9 are formed on the surfaces of the STI grooves 8. Silicon dioxide is deposited and then the STI grooves 8 are filled with silicon oxide films 10. After the surfaces of the silicon oxide films 10 is flattened using CMP, the silicon nitride film 6 is removed.

Figure 5:
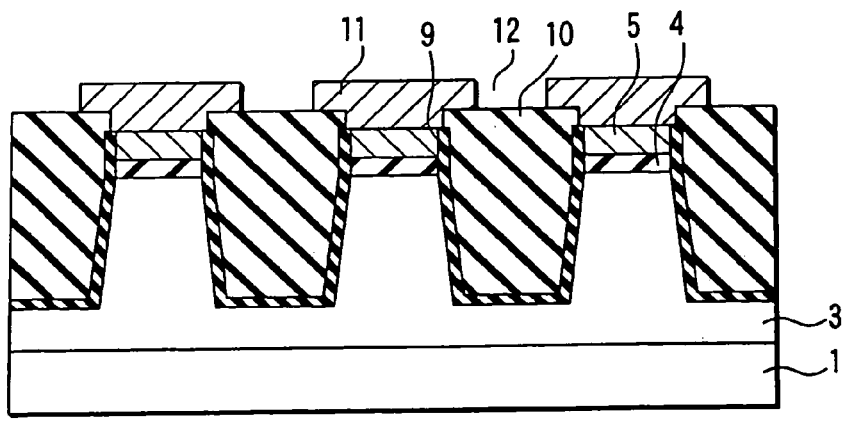
FIG. 5 is a sectional view showing a manufacturing process of the non-volatile semiconductor memory device according to the first embodiment of the present invention.

As shown in FIG. 5, polysilicon acting as a part of the gate electrode (floating gates) is deposited, and a polysilicon film 11 is formed. A resist film (not shown) is formed, and apertures corresponding to slits 12 for isolating memory cells, which are arranged along word lines, are opened through the resist film by photolithography. The polysilicon film 11 is etched using the resist film as a mask to thereby form the slits 12. Thereafter, the resist film is removed.

Figure 6:
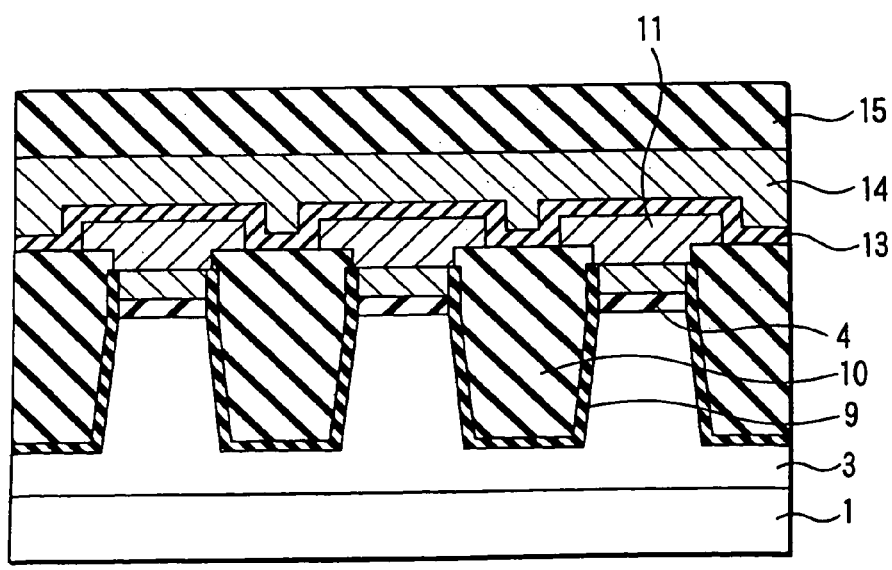
FIG. 6 is a sectional view showing a manufacturing process of the non-volatile semiconductor memory device according to the first embodiment of the present invention.

Thereafter, silicon dioxide (O)/silicon nitride (N)/silicon dioxide (O), polysilicon/tungsten silicide (WSi), and silicon nitride are sequentially deposited. With this deposition, as shown in FIG. 6, an ONO film 13, a polysilicon/WSi laminated film 14 acting as gate electrodes (control gates), and a silicon nitride film 15 acting as a gate electrode processing mask are formed.

Next, a resist film (not shown) is formed, and patterns corresponding to the gate electrodes (control gates and selection gates) are formed in the resist film using photolithography. The silicon nitride film 15 is etched using the resist film as a mask. After the resist film is removed, the polysilicon/WSi laminated film 14, the ONO film 13, the polysilicon film 11, and the polysilicon film 5 are sequentially etched using the silicon nitride film 15 as a mask, and two-layer gate electrodes are formed.

Figure 7:
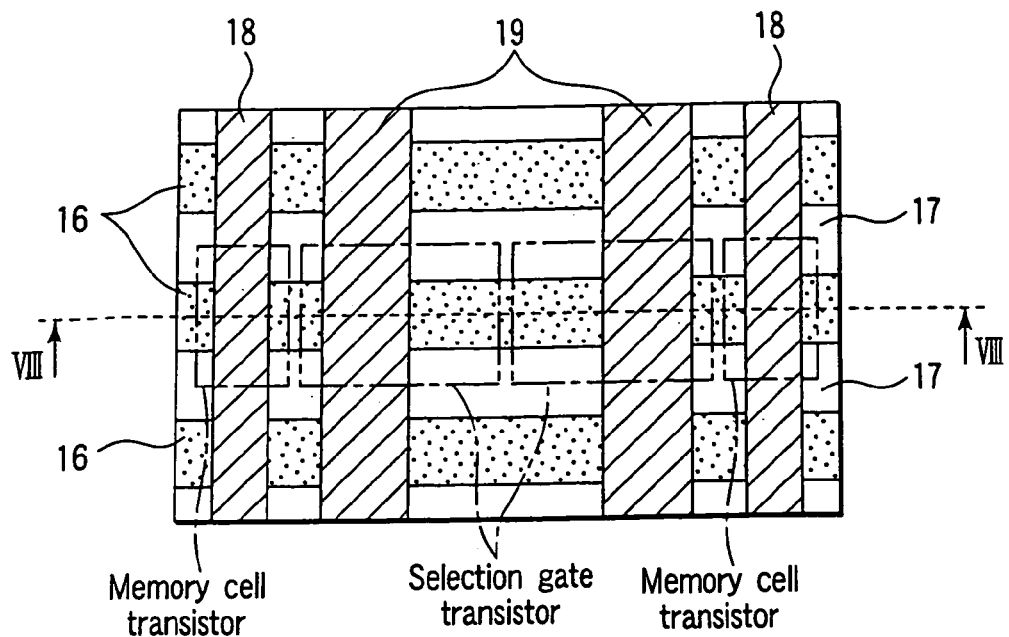
FIG. 7 is a plan view showing a part of the memory cell unit of the non-volatile semiconductor memory device according to the first embodiment of the present invention.
Figure 8:
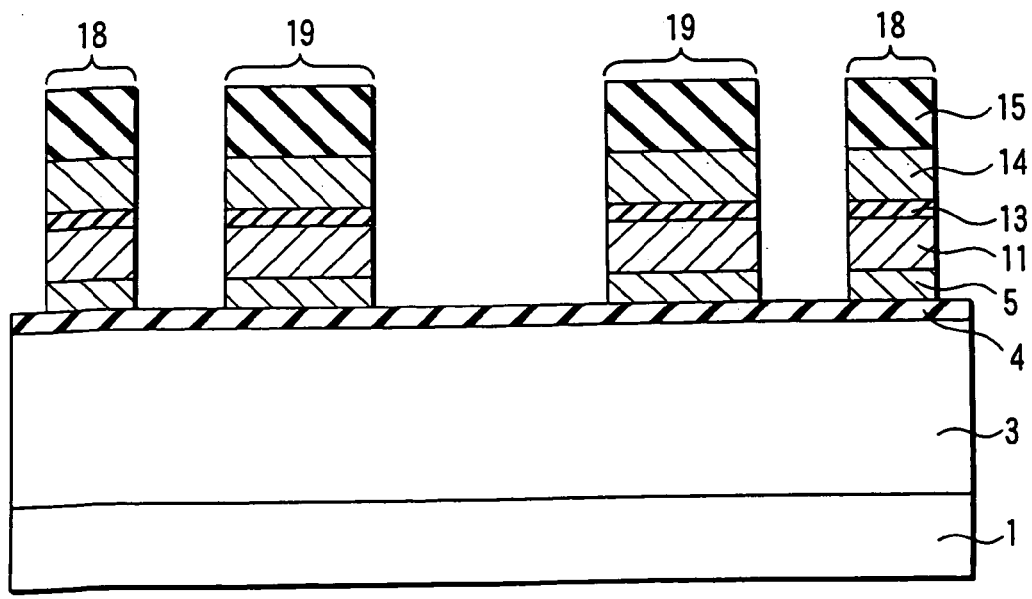
FIG. 8 is a sectional view of the non-volatile semiconductor memory device, taken along the line VIII—VIII of FIG. 7.

FIG. 7 shows a plan view of a part of the memory cell unit formed by the above method, and FIG. 8 shows the cross section of the memory cell unit, taken along the line VIII—VIII of FIG. 7.

FIG. 7 shows element regions 16, the element isolation regions 17, the gate electrodes 19 of the two adjacent, i.e. a pair of, selection gate transistors, and the gate electrodes 18 of memory cell transistors connected to the selection gate transistors.

Figure 9:
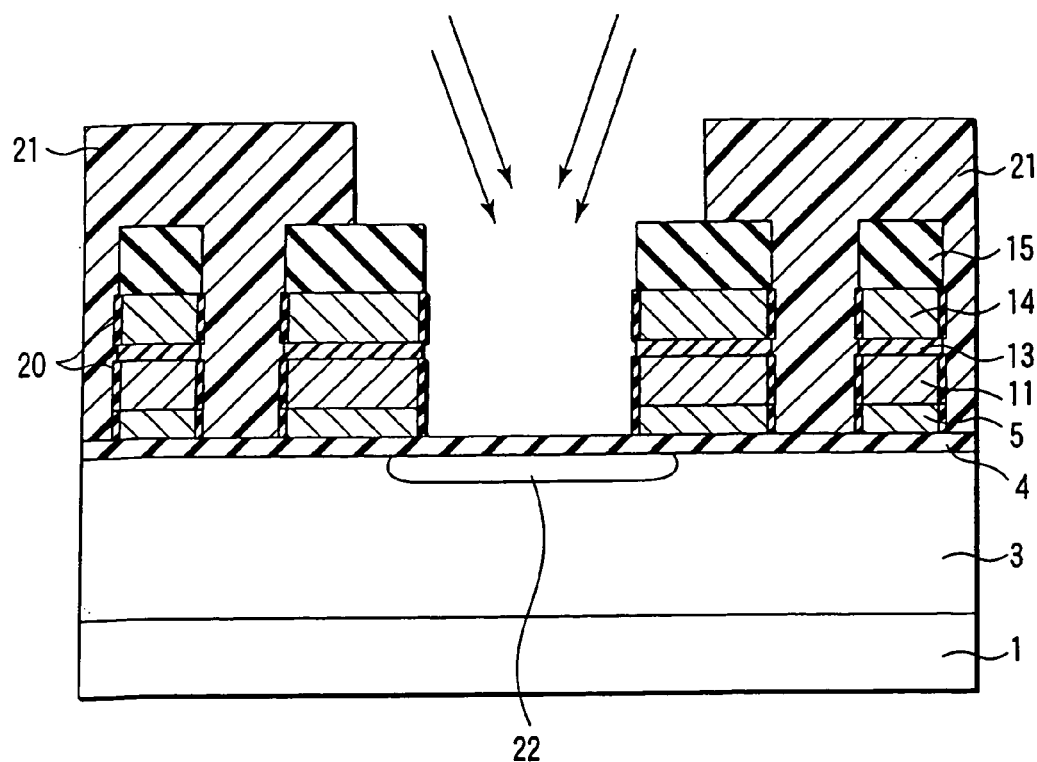
FIG. 9 is a sectional view showing a manufacturing process of the non-volatile semiconductor memory device according to the first embodiment of the present invention.

Next, as shown in FIG. 9, the sidewalls of the gate electrodes 18 of the memory cell transistors and the sidewalls of the gate electrodes 19 of the selection gate transistors are oxidized, respectively, and oxide films 20 are formed. A resist film 21 is formed, and an aperture corresponding to the region between the gate electrodes 19 of the selection gate transistors is opened through the resist film 21 using photolithography. Then, a p-type impurity having the same conductive type as that of the channels (the p-type well/channel regions 3), for example, boron (B) is ion-implanted using the resist film 21 as a mask. Note that it is preferable to perform the ion implantation twice at an angle as shown by the arrows in FIG. 9 to implant the impurity below the gate electrodes of the selection gate transistors. As a result, a region 22 the concentration of the p-type impurity of which is higher than that of the p-type well/channel regions 3 is formed in the p-type silicon substrate 1 (the p-type well/channel region 3 in this embodiment) between the gate electrodes 19 of the selection gate transistors.

Figure 10:
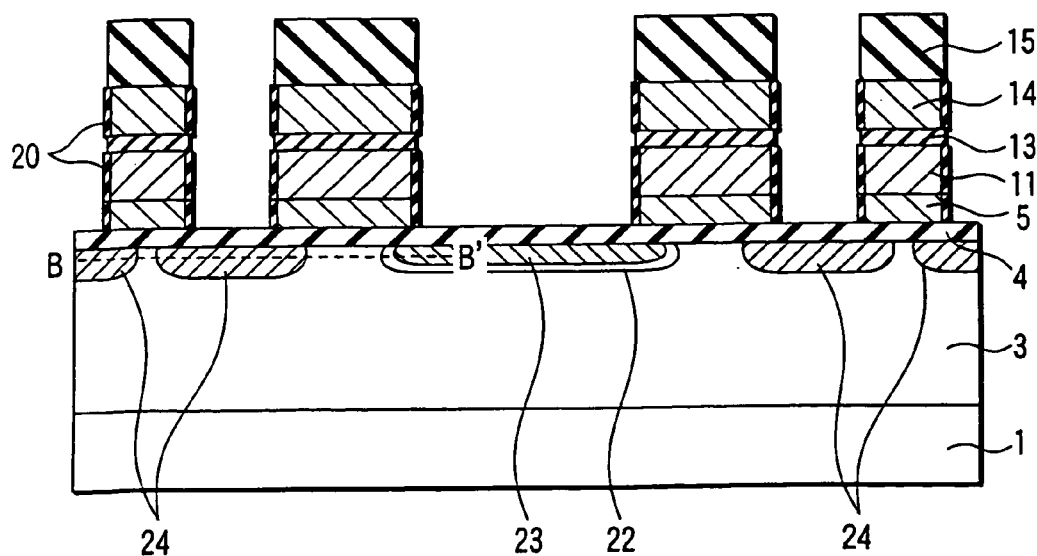
FIG. 10 is a sectional view showing a manufacturing process of the non-volatile semiconductor memory device according to the first embodiment of the present invention.

Subsequently, as shown in FIG. 10, after the resist film 21 is removed, a resist film (not shown) is formed, and an aperture corresponding to the memory cell unit is opened through the resist film using photolithography. The resist film is used as a mask, and an n-type impurity, for example, phosphorus (P) is ion-implanted in the regions where the source/drain diffusion layer regions of the memory cell transistors and the selection gate transistors are formed, and thereby the n-type source/drain diffusion layer regions 23 and 24 of the memory cell transistors and the selection gate transistors are formed. Thereafter, the resist film is removed.

At this time, the region 22 the concentration of the p-type impurity of which is higher than that of the p-type well/channel regions 3 is formed in the p-type silicon substrate 1 (the p-type well/channel regions 3 in this embodiment) between the gate electrodes 19 of the selection gate transistors. As a result, the effective concentration of impurity (the concentration of impurity obtained by subtracting the concentration of the p-type impurity from the concentration of the n-type impurity) of the n-type source/drain diffusion layer region 23 on the sides of the selection gate transistors is made lower than the effective concentration of impurity of the n-type source/drain diffusion layer regions 24 on the sides of the memory cell transistors.

Figure 11:
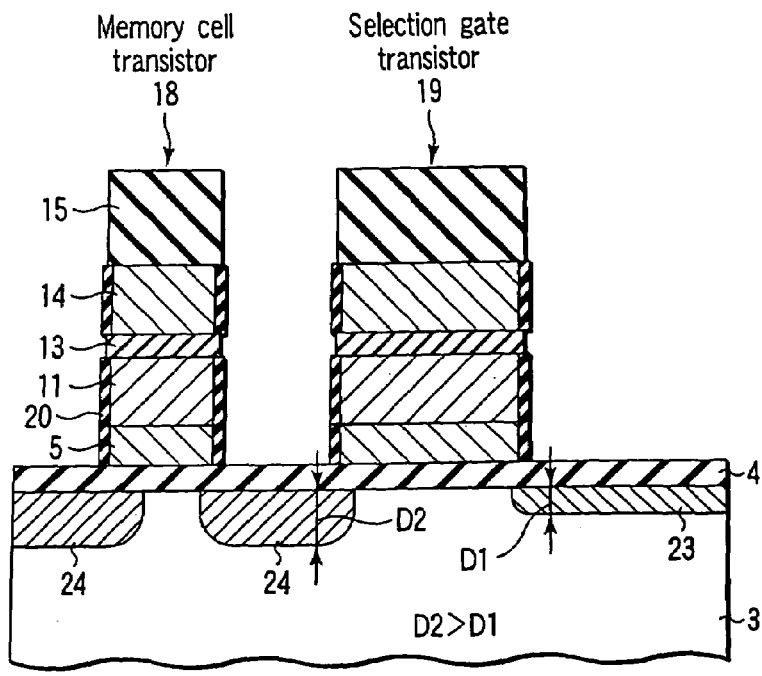
FIG. 11 is a sectional view of the non-volatile semiconductor memory device according to the first embodiment of the present invention, only a portion corresponding to the left half portion of FIG. 10 being shown for simplicity.

Further, as shown in FIG. 11, the depth D1 of the pn junction of the n-type source/drain diffusion layer region 23 taken in a source-drain direction is made shallower than the depth D2 of the n-type source/drain diffusion layer regions 24 taken in the source-drain direction on the sides of the memory cell transistors below the gate electrodes 19 of the selection gate transistors.

Figure 12:
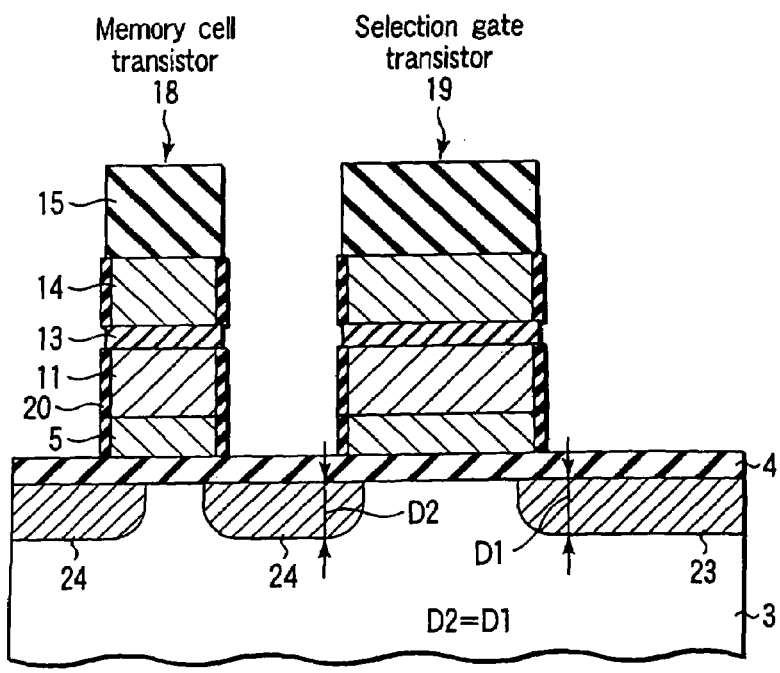
FIG. 12 is a sectional view of a conventional non-volatile semiconductor memory device.

It should be noted that when no p-type impurity would be ion-implanted between the gate electrodes of the selection gate transistors as exemplified in the conventional example, the depth D1 is equal to the depth D2 below the gate electrodes 19 of the selection gate transistors as shown in FIG. 12.

Figure 13:
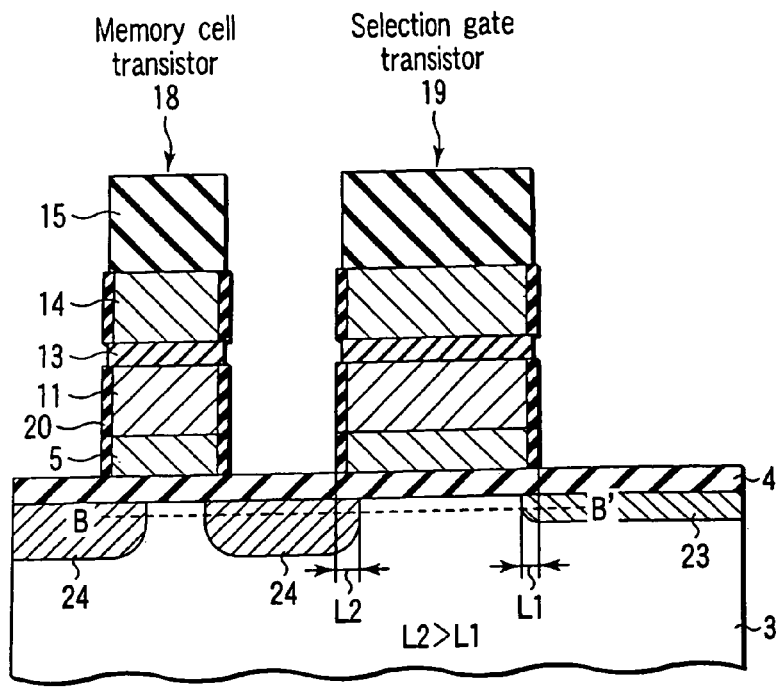
FIG. 13 is a sectional view of the non-volatile semiconductor memory device according to the first embodiment of the present invention, only a portion corresponding to the left half portion of FIG. 10 being shown for simplicity.

Further, as shown in FIG. 13, the shape of the source/drain diffusion layer region 23 is made asymmetrical to the shape of the source/drain diffusion layer regions 24. Thus, the distance L1, where the n-type source/drain diffusion layer region 23 connected to a bit line or a source line overlaps the gate electrode 19, is made smaller than the distance L2, where the n-type source/drain diffusion layer region 24 connected to a memory cell transistor overlaps the gate electrode 19, at the positions thereof which have the same depth from the boundary between the p-type silicon substrate 1 (the p-type well/channel regions 3 in this embodiment) and the gate insulation film 4 (for example, positions along the line B–B' in FIG. 13).

Figure 14:
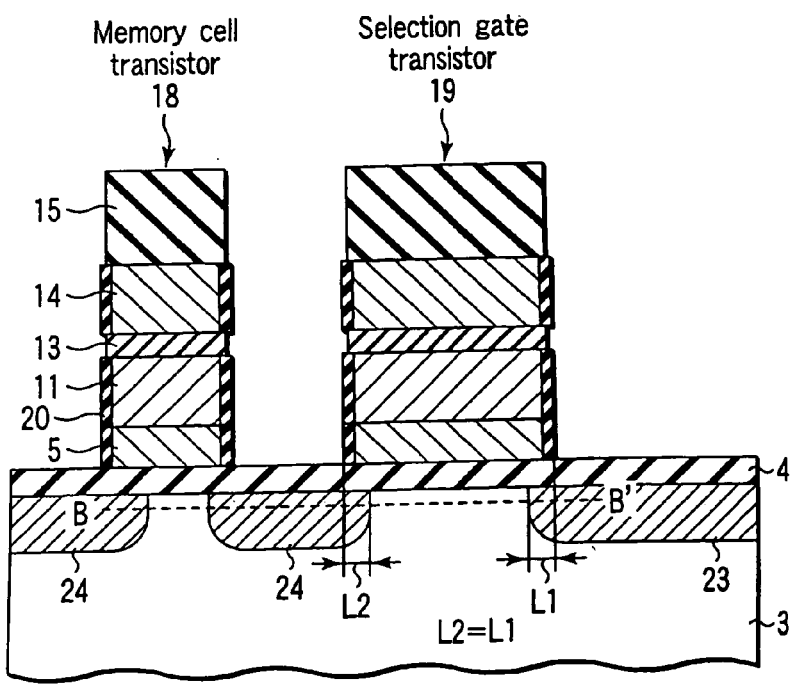
FIG. 14 is a sectional view of the conventional non-volatile semiconductor memory device.

Note that when no p-type impurity is ion-implanted between the gate electrodes of the selection gate transistors as exemplified in the conventional example, the distance L1 is equal to the distance L2 as shown in FIG. 14.

Figure 15:
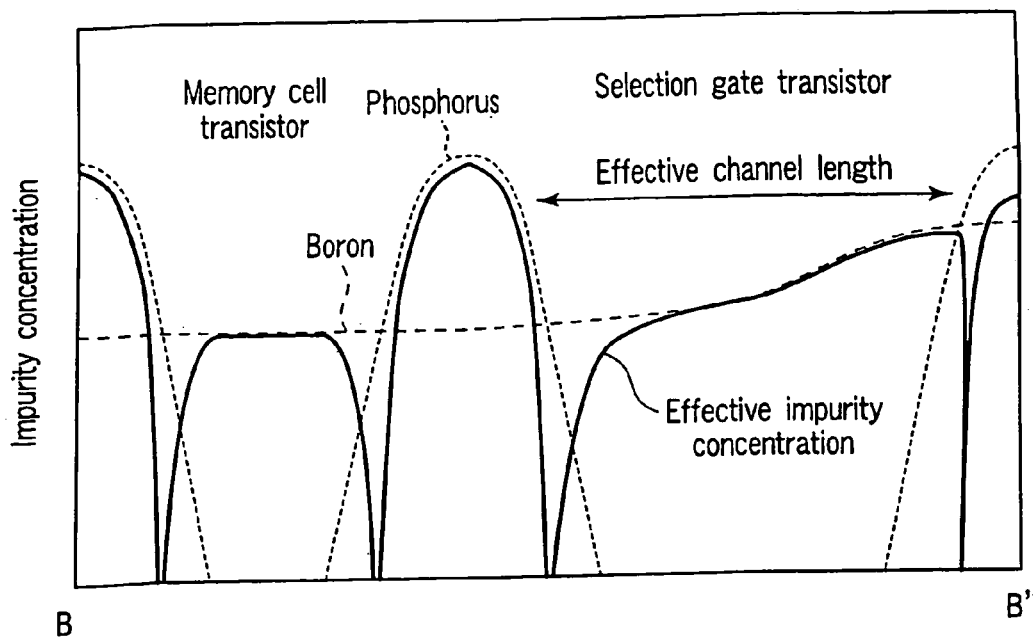
FIG. 15 is an impurity concentration distribution of the non-volatile semiconductor memory device according to the first embodiment of the present invention shown in FIG. 13, taken along the line B–B' of FIG. 13.

FIG. 15 shows the concentration distributions of the impurities at a position along the line B–B' in FIG. 13).

As shown in FIG. 15, in each of the selection gate transistors, the concentration of each impurity in the channel region thereof is different in the direction from the n-type source/drain diffusion layer 24 to the n-type source/drain diffusion layer region 23. That is, the concentration of each impurity of the channel region in contact with the n-type source/drain diffusion layer region 23, which comes into contact with the bit line or the source line, is higher than the concentration of each impurity of the channel region in contact with the n-type source/drain diffusion layer regions 24 which come into contact with the memory cell transistors.

Further, the concentration of each impurity of the channel region, which comes into contact with a source/drain diffusion layer region 24 in contact with a memory cell transistor, of the selection gate transistor is the same as the concentration of each impurity of the channel region which comes into contact with the n-type source/drain diffusion layer region 24 of the memory cell transistor.

Figure 16:
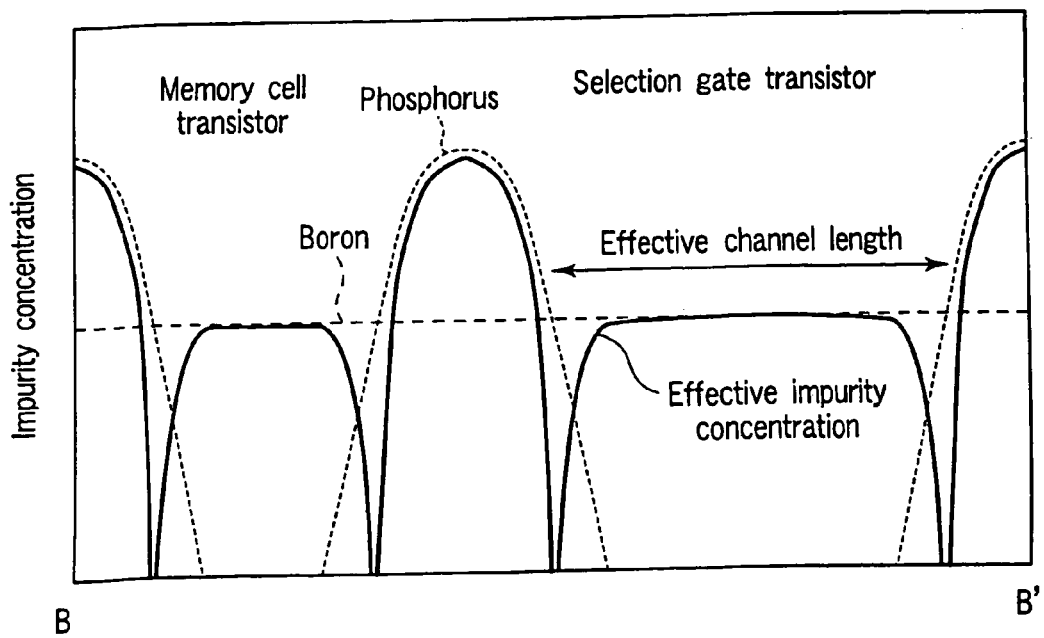
FIG. 16 is an impurity concentration distribution of the conventional non-volatile semiconductor memory device shown in FIG. 14, taken along the line B–B' of FIG. 14.

FIG. 16 shows the concentration distribution an impurity when no p-type impurity is ion-implanted between the gate electrodes of the selection gate transistors exemplified in the conventional example. Note that FIG. 16 shows the concentration distribution of each impurity at a position along the line B–B' in FIG. 14. The position of the line B–B' in FIG. 14 is the same as the position of the line B–B' shown in FIG. 13.

The effective channel length of the selection gate transistors in this embodiment shown in FIG. 15 is increased as compared with that of the conventional example shown in FIG. 16.

As described above, in this embodiment, the effective channel length of the selection gate transistors is increased by ion-implanting the p-type impurity that is the same as that of the channels between the gate electrodes of the selection gate transistors. With this arrangement, the short channel effect of the selection gate transistors is improved and the cut-off characteristics thereof are improved.

Further, the improvement of the cut-off characteristics of the selection gate transistors permits the concentration of the impurity in the channel regions of the memory cell transistors to be made lower than the conventional concentration thereof. As a result, data "1" writing characteristics are improved in the memory cell transistors. That is, resistance against non-selection write stress is more improved in, for example, a NAND type non-volatile semiconductor memory device having a memory unit containing a plurality of memory cell transistors as in this embodiment.

Further, in this embodiment, the threshold voltage of the selection gate transistors can be controlled independently of the threshold voltage of the memory cell transistors in the range in which the threshold voltage of the selection gate transistors is set higher than that of the memory cell transistors. As a result, the various characteristics of the memory cell transistors such as data holding characteristics, resistance against read stress, and the like can be improved while maintaining the cut-off characteristics of the selection gate transistors.

That is, the advantage of the embodiment is not particularly limited to the NAND type non-volatile semiconductor memory device but can be effectively obtained by any non-volatile semiconductor memory device having a structure in which selection gate transistors are connected to memory cell transistors.

Next, as shown in FIG. 17, an interlayer insulation film 25 is formed, a resist film (not shown) is formed, and an aperture corresponding to a bit line or source line contact hole is opened through the resist film using photolithography. Then, the interlayer insulation film 25 is etched using the resist film as a mask and a contact hole 26 is formed.

Thereafter, the resist film is removed. Next, an n-type impurity is ion-implanted in the p-type silicon substrate 1 (in this embodiment, the source/drain diffusion layer region 23) through the contact hole 26, when necessary, and thereby a region 27 having a higher concentration of the n-type impurity is formed.

Next, as shown in FIG. 18, a conductive material (contact filling material: plug) is formed in the contact hole 26, and then a wiring layer is formed by a generally known method. The bit line or the source line is formed by these steps. FIG. 18 particularly shows a structure in which the wiring layer connected to the conductive material is arranged as the bit line. An example of the source line is formed making use of, for example, the conductive material. As described above, the bit line or the source line is connected to the n-type source/drain diffusion layer region 23. Note that the conductive material may be omitted, and the contact hole 26 may be directly buried by the wiring layer. Thereafter, a protective layer (not shown) is formed, and thereby the non-volatile semiconductor memory device according to the first embodiment of the present invention is completed.

Note that, in this embodiment, after the p-type impurity is ion-implanted between the gate electrodes of the selection gate transistors, the n-type impurity is ion-implanted to form the n-type source/drain diffusion layer regions 23 and 24. However, the p-type impurity may be ion-implanted between the gate electrodes of the selection gate transistors after the n-type impurity is ion-implanted to form the n-type source/drain diffusion layer regions 23 and 24.

(Second Embodiment)

A second embodiment of the present invention relates to a NAND-type non-volatile semiconductor memory device having such a structure that an insulation film such as a TEOS film is formed on the sidewalls of the gate electrodes of memory cell transistors and selection gate transistors, a bit line or source line contact hole is opened between the gate electrodes of the selection gate transistors in self-alignment, and the TEOS film between the gate electrodes of the selection gate transistors and the contact hole is removed. In this device, the cut-off characteristic of the selection gate transistors is improved by implanting an impurity having the same conductive type as that of channels to the selection gate transistors on the bit line or source line contact hole sides thereof. The device according to the second embodiment will be described below together with a method of manufacturing the same.

First, the two-layer gate electrodes shown in FIG. 8 are formed in the device by the method described in the first embodiment of the present invention.

Figure 19:
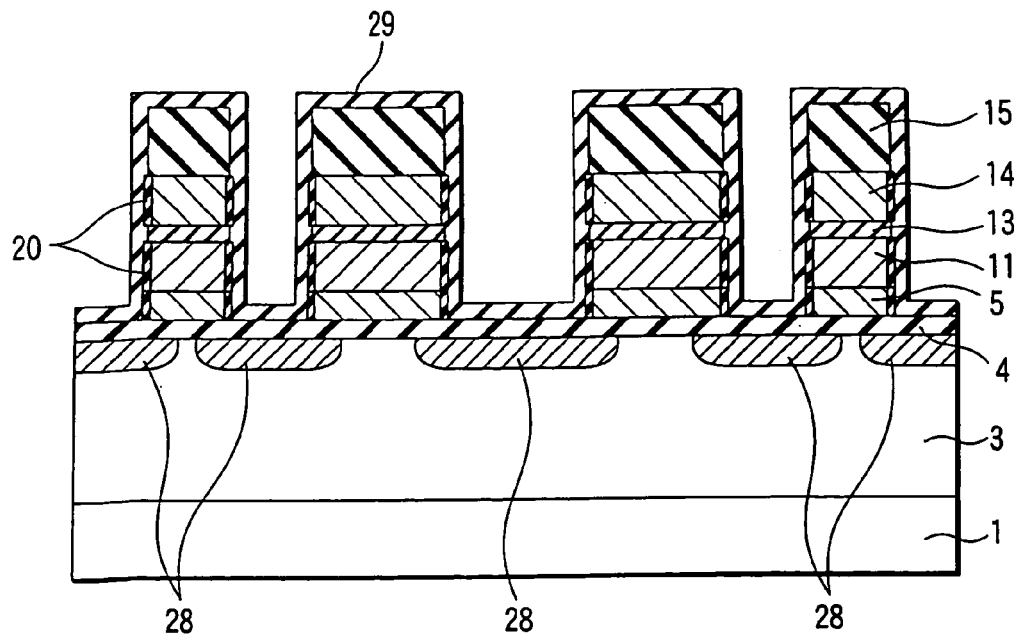
FIG. 19 is a sectional view showing a manufacturing process of a non-volatile semiconductor memory device according to a second embodiment of the present invention.

Next, as shown in FIG. 19, the sidewalls of the gate electrodes of the memory cell transistors and the selection gate transistors are oxidized, and thereby oxide films 20 are formed. A resist film (not shown) is formed, and an aperture corresponding to a memory cell unit is opened through the resist film by photolithography. An n-type impurity, for example, phosphorus (P) is ion-implanted in the regions where the source/drain diffusion layer regions of the memory cell transistors and the selection gate transistors are formed using the resist film as a mask, and thereby the n-type source/drain diffusion layer regions 28 of the memory cell transistors and the selection gate transistors are formed. Thereafter, the resist film is removed. Then, an insulation film 29, for example, a TEOS film is formed to improve hot carrier characteristics.

Figure 20:
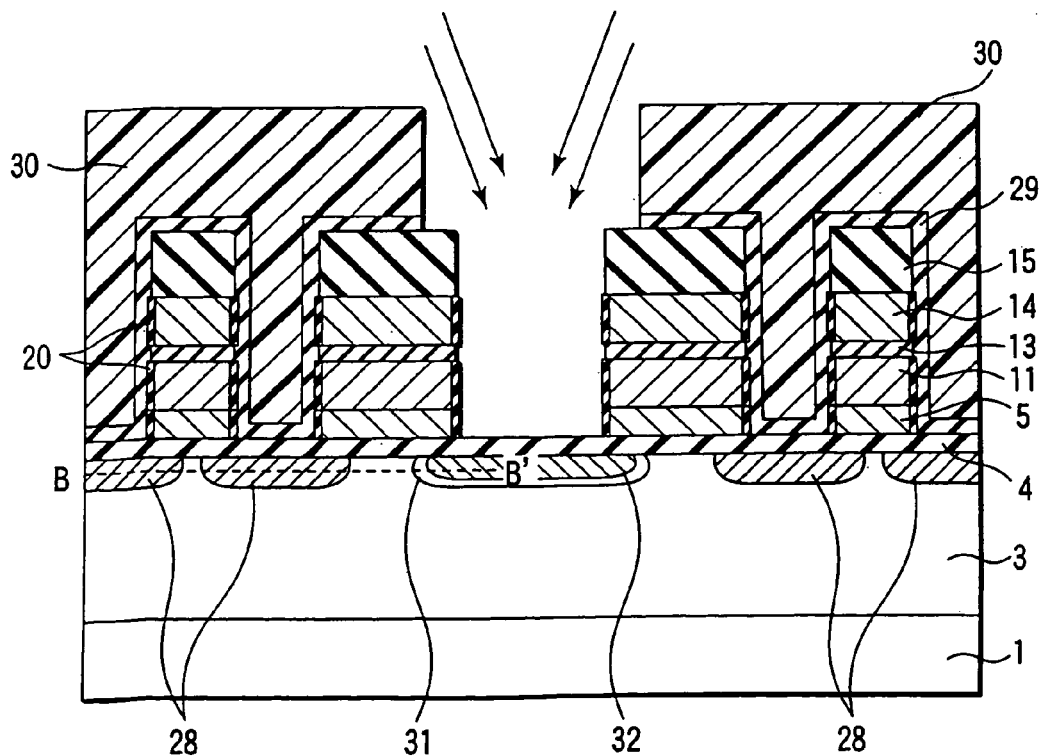
FIG. 20 is a sectional view showing a manufacturing process of the non-volatile semiconductor memory device according to the second embodiment of the present invention.

Next, as shown in FIG. 20, a resist film 30 is formed, and an aperture corresponding to the region between the gate electrodes of the selection gate transistors is opened through the resist film 30 using photolithography. The TEOS film 29 on the sidewalls of the gate electrodes of the selection gate transistors is removed using the resist film 30 as a mask to prevent the short-circuit between the gate electrodes of the selection gate transistors and a contact filling material when a contact is formed. Then, a p-type impurity that has the same conductive type as that of channels (in this embodiment, p-type well/channel regions 3), for example, boron (B) is ion-implanted using the resist film 30 as a mask. Note that it is preferable to perform the ion implantation twice at an angle as shown by the arrows in FIG. 20 to implant the impurity below the gate electrodes of the selection gate transistors. As a result, a region 31 the concentration of the p-type impurity of which is higher than that in the p-type well/channel regions 3 is formed in the p-type silicon substrate 1 (the p-type well/channel regions 3 in this embodiment) between the gate electrodes of the selection gate transistors. Accordingly, the effective concentration of impurity (the concentration of impurity obtained by subtracting the concentration of the p-type impurity from the concentration of the n-type impurity) of the n-type source/drain diffusion layer region 32 on the sides of the confronting selection gate transistors is made lower than the effective concentration of impurity of the n-type source/drain diffusion layer regions 28 on the sides of the memory cell transistors in the same manner as in the first embodiment of the present invention.

Further, the depth of the pn junction of the source/drain diffusion layer region 32 on the sides of the selection gate transistors taken in a source-drain direction is made shallower than the depth of the n-type source/drain diffusion layer regions 28 on the sides of the memory cell transistors in the source-drain direction.

Accordingly, the shape of the n-type source/drain diffusion layer regions 28 of the selection gate transistors is made asymmetrical to the shape of the source/drain diffusion layer region 32 thereof. Thus, the distance, where the n-type source/drain diffusion layer region 32 connected to a bit line or a source line overlaps the gate electrode, is made smaller than the distance, where the n-type source/drain diffusion layer region 28 connected to a memory cell transistor overlaps the gate electrode, at the positions thereof which have the same depth from the boundary between the p-type silicon substrate 1 (the p-type well/channel regions 3 in this embodiment) and a gate insulation film 4 (for example, positions along the line B—B in FIG. 20).

The impurity concentration distribution of at positions along the line B—B shown in FIG. 20 is similar to that of the first embodiment shown in FIG. 15 also in the NAND type non-volatile semiconductor memory device according to the second embodiment arranged as described above, and the same advantage as that described in the first embodiment can be obtained.

Further, according to the second embodiment of the present invention, the ion implantation is performed using the resist film 30 for removing the TEOS films 29 as the mask. With this operation, a photolithography step having only the purpose of carrying out of ion implantation to form the region the concentration of impurity of which is higher than that in the channel can be omitted, whereby a manufacturing cost can be reduced.

Note that the ion implantation that is described with reference to FIG. 20 is performed after the TEOS films 29 are removed. However, it may be performed before the TEOS films 29 are removed.

Figure 21:
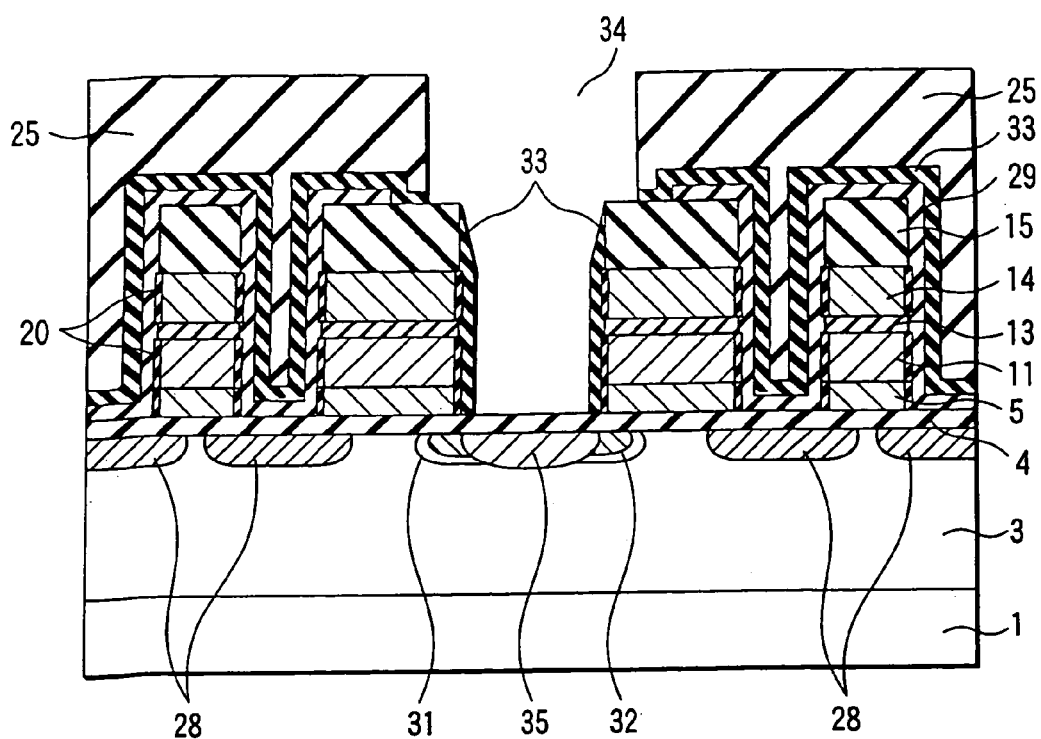
FIG. 21 is a sectional view showing a manufacturing process of the non-volatile semiconductor memory device according to the second embodiment of the present invention.

Next, as shown in FIG. 21, after the resist film 30 is removed, a silicon nitride film 33, which acts as an etching stopper member when the contact hole is opened, is formed. Thereafter, an interlayer insulation film 25 is formed. Subsequently, a resist film (not shown) is formed, and an aperture corresponding to a bit line or source line contact hole is opened through the resist film. Then, the interlayer insulation film 25 is etched using the resist film as a mask, and a contact hole 34 is formed with respect to the gate electrodes of the selection gate transistor in self-alignment. Thereafter, the resist film is removed. An n-type impurity is ion-implanted in the p-type silicon substrate 1 (in this embodiment, the source/drain diffusion layer 23) through the contact hole 34, when necessary, and thereby a region 35 having a higher concentration of the n-type impurity is formed.

Thereafter, as described above with reference to FIG. 18, a conductive material (contact filling material) is formed in the contact hole 34, a wiring layer is formed by a generally known method, and a protective film is formed, and thereby the non-volatile semiconductor memory device according to the second embodiment of the present invention is completed.

(Third Embodiment)

A third embodiment of the present invention relates to a NAND type non-volatile semiconductor memory device in which a bit line or source line contact hole is opened between the gate electrodes of selection gate transistors in self-alignment. In this device, the cut-off characteristics of the selection gate transistors are improved by implanting an impurity having the same conductive type as that of channels in the selection gate transistors on the bit line or source line contact sides thereof through a contact hole. The device according to the third embodiment of the present invention will be described below together with a method of manufacturing the same.

First, the two-layer gate electrodes shown in FIG. 8 are formed in the device by the method described in the first embodiment of the present invention.

Figure 22:
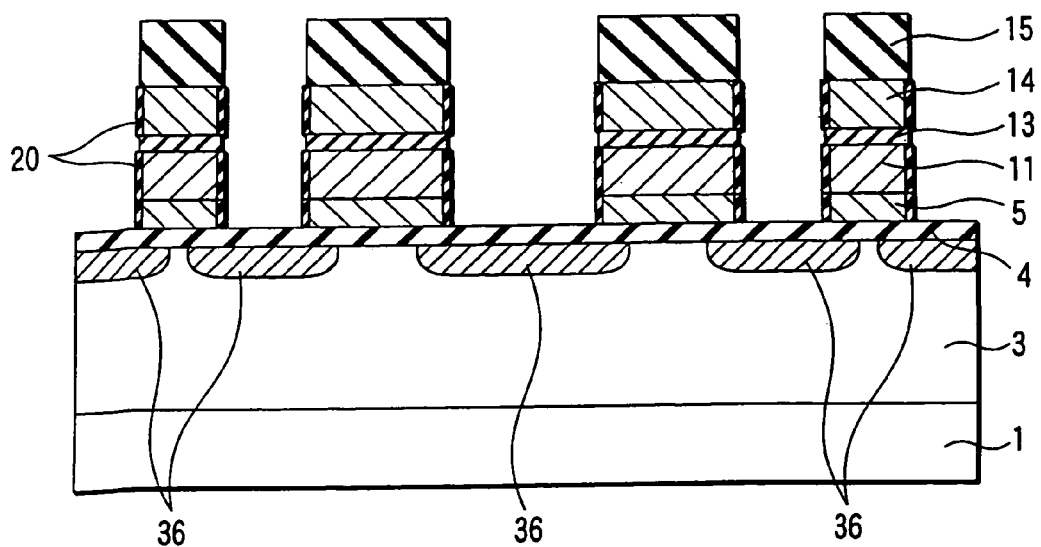
FIG. 22 is a sectional view showing a manufacturing process of a non-volatile semiconductor memory device according to a third embodiment of the present invention.

Next, as shown in FIG. 22, the sidewalls of the gate electrodes of the memory cell transistors and the selection gate transistors are oxidized, and thereby oxide films 20 are formed. A resist film (not shown) is formed, and an aperture corresponding to a memory cell unit is opened through the resist film using photolithography. An n-type impurity, for example, phosphorus (P) is ion-implanted in the regions where the source/drain diffusion layer regions of the memory cell transistors and the selection gate transistors are formed using the resist film as a mask, and thereby the n-type source/drain diffusion layer regions 36 of the memory cell transistors and the selection gate transistors are formed. Thereafter, the resist film is removed.

Figure 23:
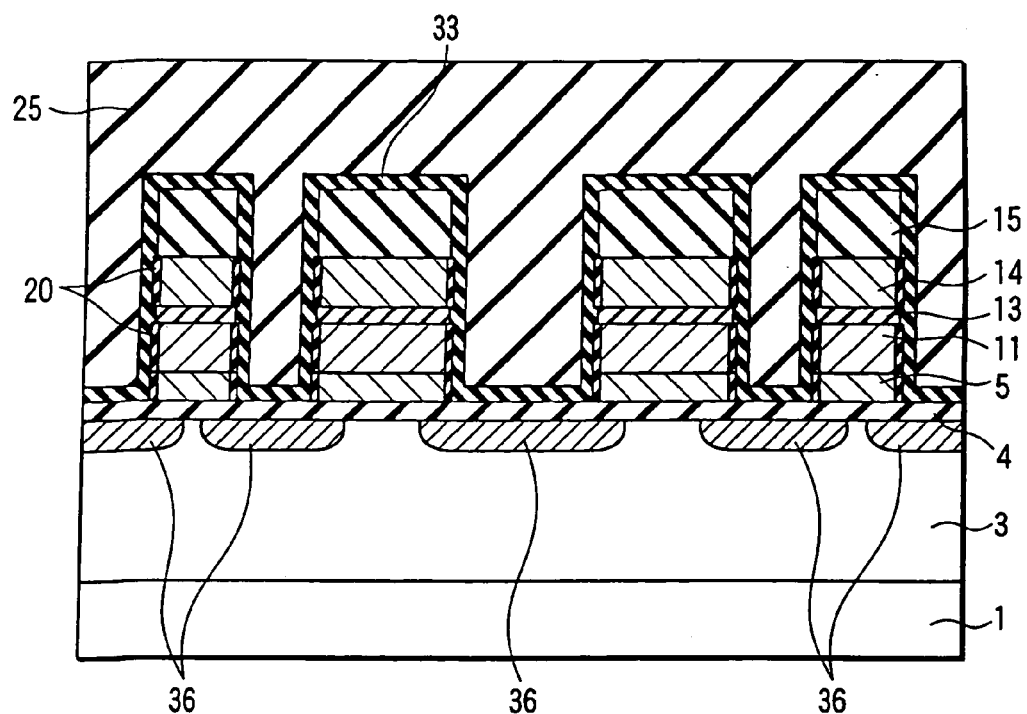
FIG. 23 is a sectional view showing a manufacturing process of the non-volatile semiconductor memory device according to the third embodiment of the present invention.

Next, as shown in FIG. 23, a silicon nitride film 33, which acts as an etching stopper member when the contact hole 37 is opened, is formed, and then an interlayer insulation film 25 is formed.

Figure 24:
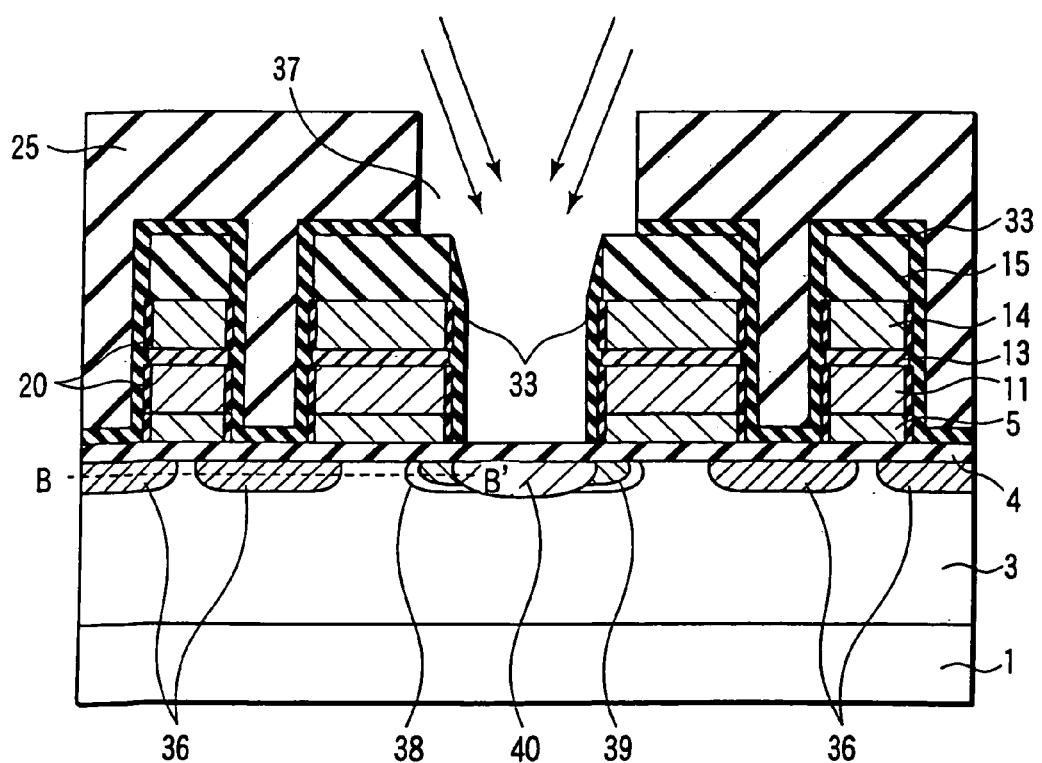
FIG. 24 is a sectional view showing a manufacturing process of the non-volatile semiconductor memory device according to the third embodiment of the present invention.

Next, as shown in FIG. 24, a resist film (not shown) is formed, and an aperture, which corresponds to the bit line or source line contact hole 37, is opened through the resist film. Then, the interlayer insulation film 25 is etched using the resist film as a mask, and the contact hole 37 is formed with respect to the gate electrodes of the selection gate transistors in self-alignment. Thereafter, the resist film is removed. Then, a p-type impurity having the same conductive type as that of the channels (p-type well/channel regions 3 in this embodiment), for example, boron (B) is ion-implanted through the contact hole 37. Note that it is preferable to perform the ion implantation twice at an angle as shown by the arrows in FIG. 24 to implant the impurity below the gate electrodes of the selection gate transistors. As a result, a region 38 the concentration of the p-type impurity of which is higher than that in the p-type well/channel regions 3 is formed in a p-type silicon substrate 1 (the p-type well/channel regions 3 in this embodiment) between the gate electrodes of the selection gate transistors. Accordingly, the effective concentration of impurity (the concentration of impurity obtained by subtracting the concentration of the p-type impurity from the concentration of the n-type impurity) of the n-type source/drain diffusion layer region 39 on the sides of the confronting selection gate transistors is made lower than the effective concentration of impurity of the n-type source/drain diffusion layer region 36 on the sides of the memory cell transistors.

Further, the depth of the pn junction of the source/drain diffusion layer region 39 on the sides of the confronting selection gate transistors in a source-drain direction is made shallower than the depth of the n-type source/drain diffusion layer regions 36 on the sides of the memory cell transistors in the source-drain direction.

Accordingly, the shape of the n-type source/drain diffusion layer regions 36 of the selection gate transistors is made asymmetrical to shape of the source/drain diffusion layer region 39 thereof. Thus, the distance, where the n-type source/drain diffusion layer region 39 connected to a bit line or a source line overlaps the gate electrode, is made smaller than the distance, where the n-type source/drain diffusion layer region 36 connected to a memory cell transistor overlaps the gate electrode, at the positions thereof which have the same depth from the boundary between the p-type silicon substrate 1 (the p-type well/channel regions 3 in this embodiment) and a gate insulation film 4 (for example, positions along the line B—B in FIG. 24).

The impurity concentration distribution at positions along the line B—B shown in FIG. 24 is similar to that of the first embodiment shown in FIG. 15 also in the NAND type non-volatile semiconductor memory device according to the third embodiment arranged as described above, and the same advantage as that described in the first embodiment of the present invention can be obtained.

Further, according to the third embodiment of the present invention, the cut-off characteristics of the selection gate transistors can be improved without increasing a photolithography step aiming at performing only ion implantation for forming the region the concentration of impurity of which is higher than that in the channel by performing the ion implantation to the gate electrodes of the selection gate transistors through the contact hole formed in self-alignment even if a photolithography step for exfoliating a TEOS film as described in the second embodiment is omitted. Therefore, the third embodiment can reduce a manufacturing cost as compared with, for example, the first embodiment of the present invention.

However, even if a photolithography step for removing the TEOS film as described in the second embodiment is employed, it is also possible to perform ion implantation to the gate electrodes of the selection gate transistors through the contact hole formed in self-alignment as in the third embodiment of the present invention. The manufacturing cost can be advantageously reduced also in this case.

Then, an n-type impurity is ion-implanted in the p-type silicon substrate 1 (in this embodiment, the n-type source/drain diffusion layer 39) through the contact hole 37, when necessary, and thereby a region 40 having a higher concentration of the n-type impurity is formed.

Thereafter, as described above with reference to FIG. 18, a conductive material (contact filling material) is formed in the contact hole 37, a wiring layer is formed by a generally known method, and a protective film is formed, and thereby the non-volatile semiconductor memory device according to the third embodiment of the present invention is completed.

(Fourth Embodiment)

In a fourth embodiment of the present invention, the cut-off characteristics of selection gate transistors are improved by implanting an impurity having the same conductive type as that of channels in the selection gate transistors on the bit line or source line contact sides thereof at an angle for permitting the impurity to be implanted only between the gate electrodes of the selection gate transistors without implanting the impurity between the gate electrodes of memory cell transistors.

First, the two-layer gate electrodes shown in FIG. 8 are formed in the device by the method described in the first embodiment of the present invention.

Figure 25:
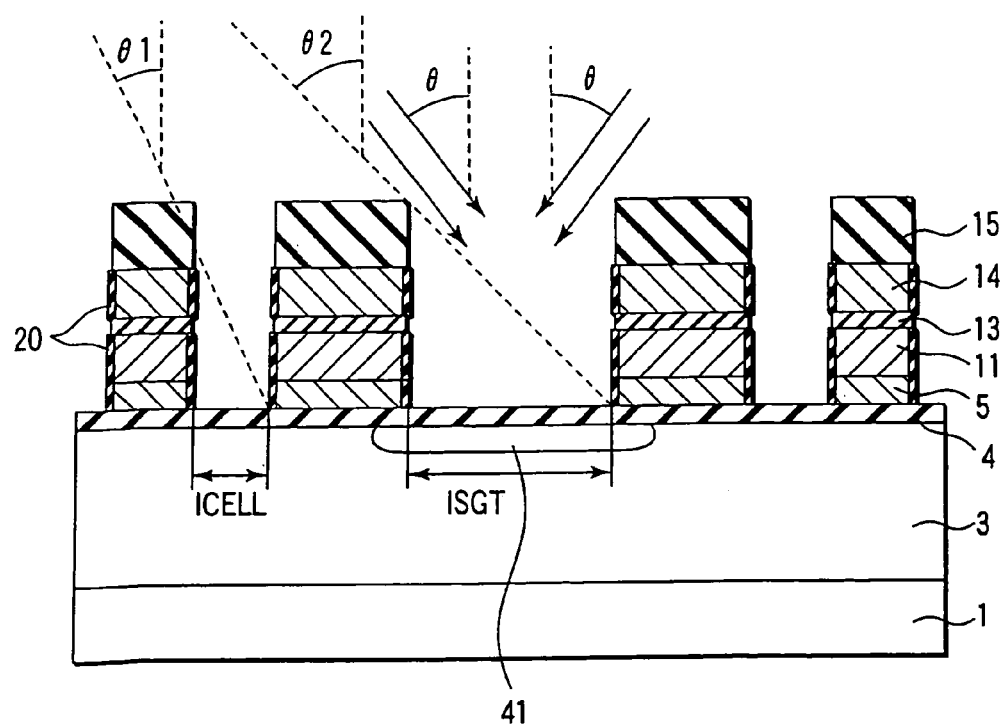
FIG. 25 is a sectional view showing a manufacturing process of a non-volatile semiconductor memory device according to a fourth embodiment of the present invention.

Next, as shown in FIG. 25, the sidewalls of the gate electrodes of the memory cell transistors and the selection gate transistors are oxidized, and thereby oxide films 20 are formed. A resist film (not shown) is formed, and an aperture corresponding to a memory cell unit is opened through the resist film using photolithography. Then, a p-type impurity having the same conductive type as that of channels (p-type well/channel regions 3 in this embodiment), for example, boron (B) is ion-implanted. At this time, the ion implantation is carried out at an angle θ which will be described below.

In general, in a non-volatile semiconductor memory device, the distance $1_{SGT}$ between the gate electrodes of selection gate transistors is set larger than the distance between the gate electrodes of the memory cell transistors and the distance $1_{CELL}$ between the gate of a memory cell transistor and the gate of a selection gate transistor because it is necessary to cause the space between the gate electrodes of the selection gate transistors to come into contact with a bit line or a source line. Thus, as shown in FIG. 25, there is an angle θ1 at which no impurity is implanted in the p-type silicon substrate 1 (the p-type well/channel regions 3 in this embodiment) between the gate electrodes of the memory cell transistors and between the gate electrode of a memory cell transistor and the gate electrode of a selection gate transistor because a gate electrode acts as a shield. Likewise, there is an angle θ2 at which no impurity is implanted in the p-type silicon substrate 1 between the gate electrodes of the selection gate transistors. Accordingly, when the impurity is implanted at the ion implantation angle θ that satisfies the condition "θ1<θ<θ2", the impurity can be implanted in the p-type silicon substrate 1 only between the gate electrodes of the selection gate transistors.

An example for specifically prescribing the angle θ1 is an angle within such a range that when a straight line vertical to the p-type silicon substrate 1 is rotated about the lowest point of the sidewall, which is located on the side of a memory cell transistor, of the gate electrode of a selection gate transistor as a center of rotation, the straight line intersects the gate electrode of the memory cell transistor.

Further, an example for specifically prescribing the angle $\theta 2$ is an angle within such a range that when a straight line vertical to the p-type silicon substrate 1 is rotated about the lowest point of the sidewall of a selection gate transistor that confronts the gate electrode of the other selection gate transistor, the straight line does not intersect the gate electrode of the other confronting selection gate transistor.

Note that it is necessary to perform the ion implantation twice at angles "±θ" as shown by the arrows in FIG. 25 to implant the impurity below the gate electrodes of the selection gate transistors. As a result, a region 41 the concentration of the p-type impurity of which is higher than that in the p-type well/channel regions 3 is formed in the p-type silicon substrate 1 (the p-type well/channel regions 3 in this embodiment) between the gate electrodes of the selection gate transistors.

Figure 26:
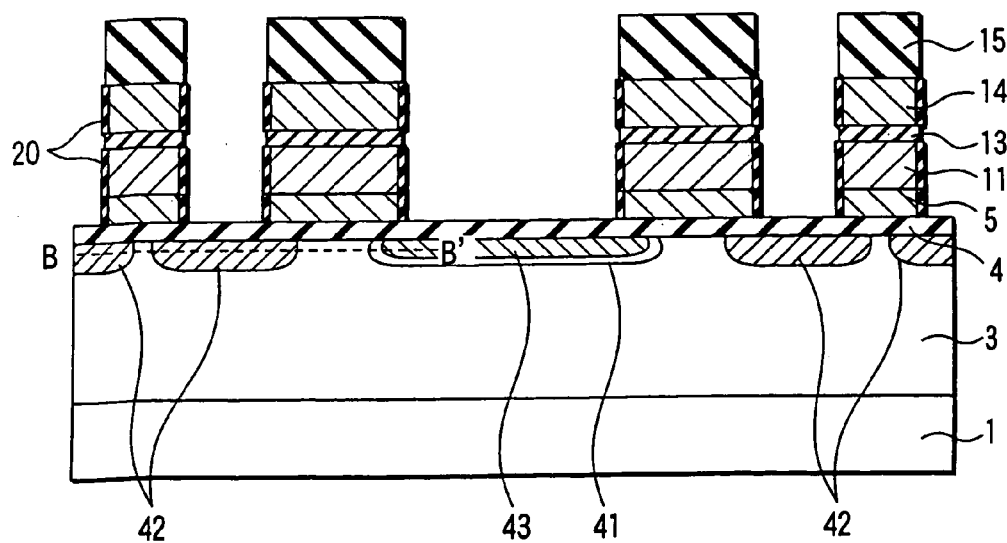
FIG. 26 is a sectional view showing a manufacturing process of the non-volatile semiconductor memory device according to the fourth embodiment of the present invention.

Next, as shown in FIG. 26, the n-type source/drain diffusion layer regions 42 and 43 of the memory cell transistors and the selection gate transistors are formed by subsequently ion implanting an n-type impurity, for example, phosphorous (P) in the regions where the n-type source/drain diffusion layer regions 42 and 43 are formed using the resist film (not shown) having the aperture corresponding to the memory cell unit as a mask. Thereafter, the resist film is removed.

At this time, the region 41 the concentration of the p-type impurity of which is higher than that in the p-type well/channel regions 3 is formed in the p-type silicon substrate 1 (the p-type well/channel regions 3 in this embodiment) between the gate electrodes of the selection gate transistors. As a result, the effective concentration of impurity (the concentration of impurity obtained by subtracting the concentration of the p-type impurity from the concentration of the n-type impurity) of the n-type source/drain diffusion layer region 43 on the sides of the confronting selection gate transistors is made lower than the effective concentration impurity of the n-type source/drain diffusion layer regions 42 on the sides of the memory cell transistors.

Further, the depth of the pn junction of the source/drain diffusion layer region 43 on the sides of the confronting selection gate transistors is made shallower than the depth of the n-type source/drain diffusion layer regions 42 on the sides of the memory cell transistors in a source-drain direction.

Accordingly, the shape of the n-type source/drain diffusion layer regions 42 of the selection gate transistors is made asymmetrical to shape of the source/drain diffusion layer region 43 thereof. Thus, the distance, where the n-type source/drain diffusion layer region 43 connected to a bit line or a source line overlaps the gate electrode, is made smaller than the distance, where the n-type source/drain diffusion layer region 42 connected to a memory cell transistor overlaps the gate electrode, at the positions thereof which have the same depth from the boundary between the p-type silicon substrate 1 (the p-type well/channel regions 3 in this embodiment) and a gate insulation film 4 (for example, positions along the line B—B in FIG. 26).

The impurity concentration distribution at positions along the line B—B shown in FIG. 26 is similar to that of the first embodiment shown in FIG. 15 also in the NAND type non-volatile semiconductor memory device according to the fourth embodiment arranged as described above, and the same effect as that described in the first embodiment can be obtained.

Further, according to the fourth embodiment, the cut-off characteristics of the selection gate transistors can be improved without increasing a photolithography step aiming at only ion implantation for forming the region the concentration of impurity of which is made higher than that of the channel by implanting the impurity so that the ion implantation angle θ satisfies the condition "$\theta 1 < \theta < \theta 2$". Therefore, the fourth embodiment can reduce a manufacturing cost as compared with, for example, the first embodiment of the present invention.

Figure 27:
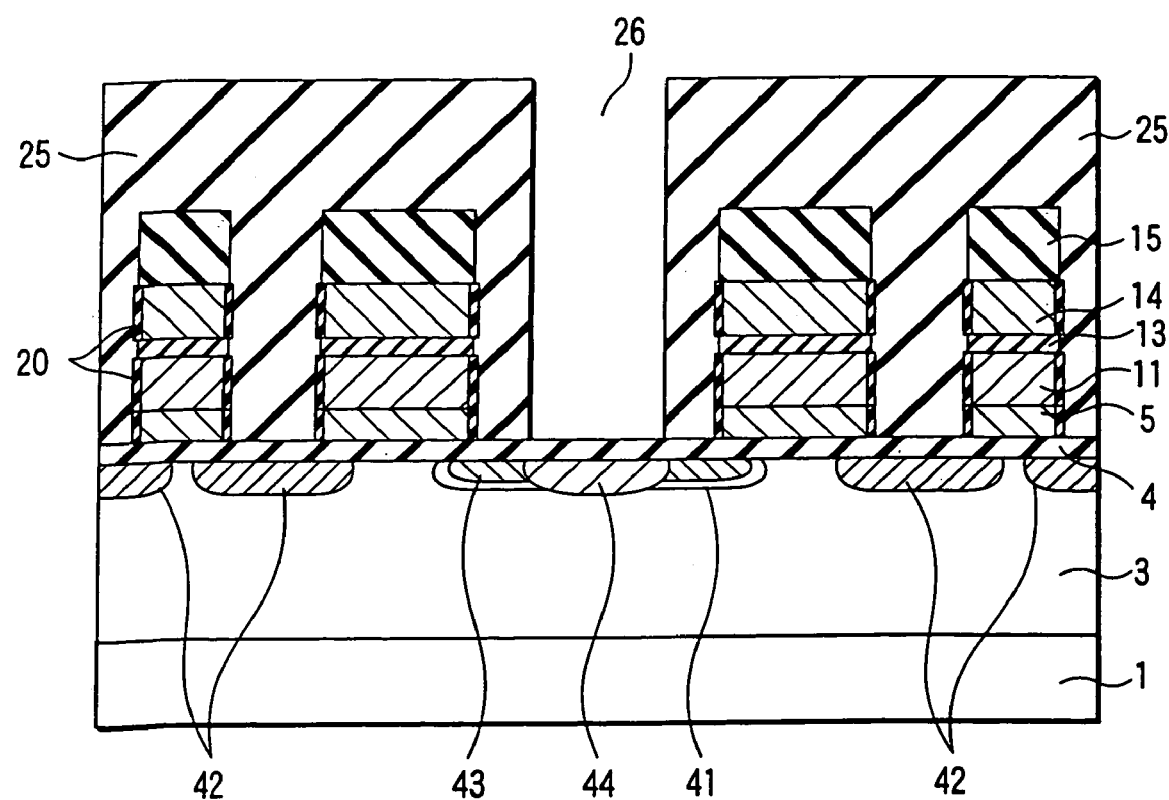
FIG. 27 is a sectional view showing a manufacturing process of the non-volatile semiconductor memory device according to the fourth embodiment of the present invention.

Next, as shown in FIG. 27, an interlayer insulation film 25 is formed. Thereafter, a resist film (not shown) is formed, and an aperture corresponding to a bit line or source line contact hole 26 is opened. Then, the interlayer insulation film 25 is etched using the resist film as a mask and the contact hole 26 is formed. Thereafter, the resist film is removed. Then, an n-type impurity is ion-implanted in the p-type silicon substrate 1 (in this embodiment, the n-type source/drain diffusion layer 43) through the contact hole 26, when necessary, and thereby a region 44 having a higher concentration of the n-type impurity is formed.

Thereafter, as described above with reference to FIG. 18, a conductive material (contact filling material) is formed in the contact hole 26, a wiring layer is formed by a generally known method, and a protective film is formed, and thereby the non-volatile semiconductor memory device according to the fourth embodiment is completed.

The embodiment shows an example in which the bit line or source line contact hole 26 is not formed in self-alignment with respect to the gate electrodes of the selection gate transistors. However, it is also possible to form the bit line or source line contact hole 26 in self-alignment.

Further, in this embodiment, the n-type impurity for forming the n-type source/drain diffusion layer regions 42 and 43 is ion-implanted after the p-type impurity is ion-implanted between the gate electrodes of the selection gate transistors at the angle θ that satisfies the condition "$\theta 1 < \theta < \theta 2$". However, the p-type impurity may be ion-implanted between the gate electrodes of the selection gate transistors at the above angle θ after the n-type impurity for forming the n-type source/drain diffusion layer regions 42 and 43 is ion-implanted.

While the element isolation regions 17 are formed after the well/channel regions 3 and the gate insulation film 4 are formed in the first to fourth embodiments, the well/channel regions 3 may be formed after the element isolation regions 17 are formed.

While not shown in the first to fourth embodiments, the n-type source/drain diffusion layer regions of the memory cell transistors and the selection gate transistors may be arranged as an LLD (lightly doped drain) structure by forming sidewalls to the gate electrodes thereof using a generally known method and by ion-implanting an n-type impurity more heavily.

While the first to fourth embodiments exemplify the non-volatile semiconductor memory device having the memory cell unit including the plurality of memory cell transistors, a non-volatile semiconductor memory device having a memory cell unit including at least one memory cell transistor can achieve the above advantage.

Further, it is a matter of course that the first to fourth embodiments can be embodied independently or by being appropriately combined with each other.

Furthermore, the first to fourth embodiments contain various steps of invention that can be also extracted by appropriately combining the plurality of constituent features disclosed in the first to fourth embodiments.

As described above, in each of the embodiments, there can be provided the non-volatile semiconductor memory device, which is excellent in the various characteristics of the memory cell transistors such as data writing characteristics, data maintaining characteristics, resistance against read stress as well as excellent in the cut-off characteristics of the selection gate transistors, and the method of manufacturing the same.

(Fifth Embodiment)

A fifth embodiment of the present invention describes a NAND type flash memory having a two-layer gate structure having such a structure in which the cut-off characteristics of a selection gate transistor are improved and a method of manufacturing the same with reference to FIG. 28 to FIG. 43.

The fifth embodiment is characterized in that after channel regions of a memory cell and selection gate transistors are formed and element isolation regions are formed, a mask for patterning the channel regions of the selection gate transistors only is formed, then and an impurity is ion-implanted through a part of gate electrodes.

Figure 28:
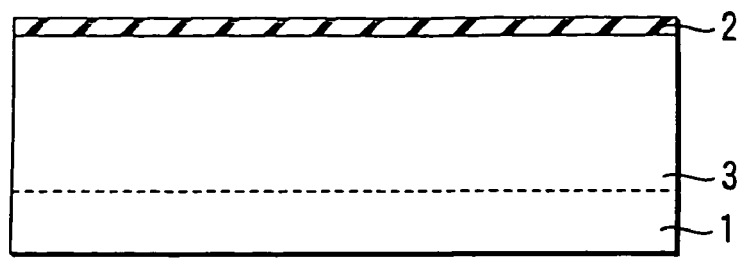
FIG. 28 is a sectional view showing a manufacturing step of a NAND type flash memory having a two-layer gate structure according to a fifth embodiment of the present invention.

First, as shown in FIG. 28, a buffer oxide film 2 is formed on a p-type silicon substrate 1. Then, a resist (not shown) is coated thereon and the resultant resist layer is patterned to form wells and channels by the use of the photolithography method. After that, an n-type impurity (for example, P (phosphorus)) and a p-type impurity (for example, B (boron)) are appropriately doped thereto by ion implantation, whereby an n-type well (not shown) and a p-type well/channel region 3 is formed.

Figure 29:
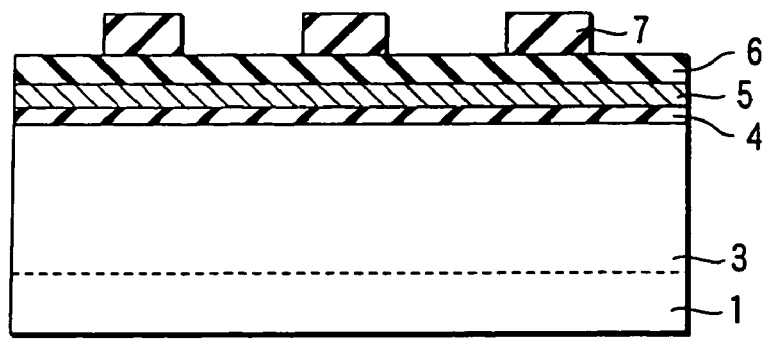
FIG. 29 is a sectional view showing a manufacturing step following the manufacturing step of FIG. 28.

Next, as shown in FIG. 29, after removing the buffer oxide film 2, a gate insulation film 4 for transistors is formed, a polysilicon layer 5 which forms a part of the gate electrode and a silicon nitride film 6 which serves as a mask for STI (Shallow Trench Isolation) process are deposited, a resist 7 is coated, and the resultant resist layer is patterned to from the element isolation regions by the use of the photolithography method.

However, the gate insulation film 4 is not limited to a silicon oxide film, but other films such as a silicon nitride film may be used.

Figure 30:
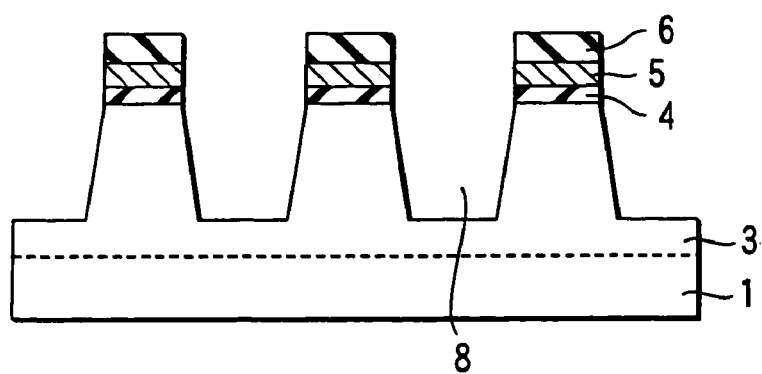
FIG. 30 is a sectional view showing a manufacturing step following the manufacturing step of FIG. 29.

Next, as shown in FIG. 30, after etching the silicon nitride film 6 by the use of the resist 7 as a mask and removing the resultant resist layer 7, the polysilicon layer 5, the gate insulation film 4, and the silicon substrate 1 are etched sequentially using the silicon nitride film 6 as a mask, whereby an STI slit 8 which provides an element isolation region is formed.

Next, as shown in FIG. 31, a thin silicon oxide film 9 is formed on the surface of each STI slit 8. After that, the silicon STI slit 8 is buried with a silicon oxide film 10 and the surface buried silicon oxide film 10 is flattened using the CMP (chemical-mechanical polishing), and then the silicon nitride film 6 is removed.

FIG. 32 is a plan view illustrating a part of the NAND type flash memory shown in FIG. 31. In this figure, activation regions 51 and element isolation regions 52 are shown.

FIG. 33 shows a sectional view of the activation region of the memory cell, taken along the line XXXIII—XXXIII of FIG. 32.

Then, as shown in FIG. 34, a resist 53 is coated and the resultant resist layer 53 is patterned to form the channel region of the selection gate transistors with the photolithography method. A p-type impurity (for example, boron (B)) is doped through the open pattern by ion implantation, whereby a region 54 of higher impurity density than that of the memory cell is formed in the channel region of the selection gate transistor. A resist mask 53 is patterned so as not to expose the channel region of the memory cell even when the mask is misaligned.

Next, as shown in FIG. 35, after removing the resist 53, a polysilicon layer 11 from which a floating gate electrode of the memory cell and a gate electrode of the selection gate transistor are formed is deposited. Then, a resist (not shown) is coated, the resultant resist layer is patterned to have an opening corresponding to a slit between the floating gates on the element insulation region by the use of the photolithography method. The polysilicon layers 11 and 5 are etched to form the slit, and the resist is removed. After that, an ONO (oxide-nitride-oxide) film 13 and a polysilicon/WSi laminated film 14 from which a control gate is formed are deposited, and further a silicon nitride film 15 serving as a mask for forming gate electrodes is laid thereon.

Figure 36:
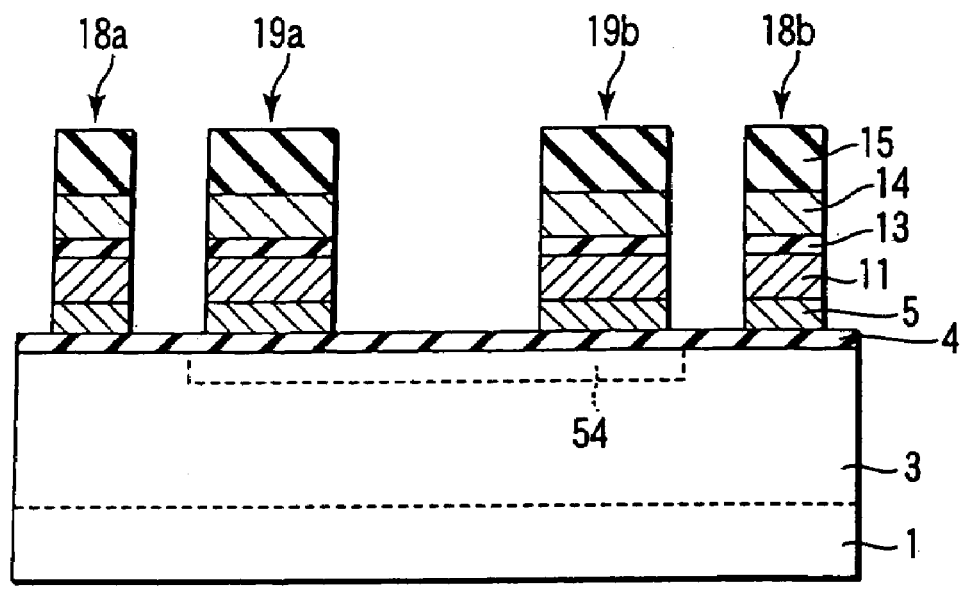
FIG. 36 is a sectional view showing a manufacturing step following the manufacturing step of FIG. 35.

Next, as shown in FIG. 36, a resist (not shown) is coated, the resultant resist layer is patterned to form the gate electrodes by the use of the photolithography method. The silicon nitride film is etched using the resist pattern, and then the resist layer is removed.

After that, the polysilicon/WSi laminated film 14, ONO film 13, and polysilicon layers 11 and 5 are etched sequentially, whereby gate electrodes 19a and 19b of the selection gate transistors and gate electrodes 18a and 18b of the memory cells are formed.

Figure 37:
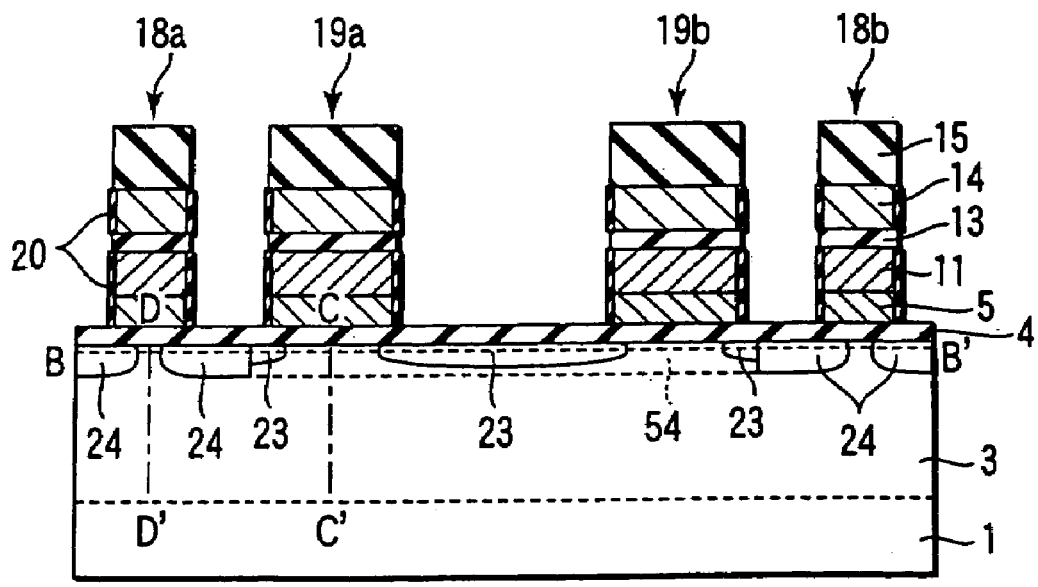
FIG. 37 is a sectional view showing a manufacturing step following the manufacturing step of FIG. 36.

Next, as shown in FIG. 37, side walls of the gate electrodes 18a and 18b of the memory cells and side walls of the gate electrodes 19a and 19b of a pair of selection gate transistors which are located adjacent to each other are oxidized for forming an oxide film 20 on each of the side walls. Then, a resist (not shown) is coated, the resultant resist layer is patterned to form the channel regions using the photolithography method. Through the open pattern, an n-type impurity (for example, P (phosphorus)) is ion-implanted between the gate electrodes of two memory cells located adjacent to each other, between the gate electrode of the memory cell and the gate electrode of the selection gate transistor positioned adjacent thereto, and between the gate electrodes of memory cells located adjacent to each other, and a source/drain diffusion layer of the memory cells and a source/drain diffusion layer of the selection gate transistors are formed in the p-well 3. After that, the resist layer is removed.

In each channel region of the selection gate transistors, as mentioned above, the P-region 54 having a higher impurity concentration than that of the well region 3 has already been formed as mentioned above. Therefore, the effective impurity concentration (the concentration of impurity obtained by subtracting the concentration of the p-type impurity from the concentration of the n-type impurity) of a source/drain diffusion layer 23 between the two selection gate transistors located adjacent to each other is made smaller than the effective impurity concentration of a source/drain diffusion layer 24 of the memory cells.

Figure 38:
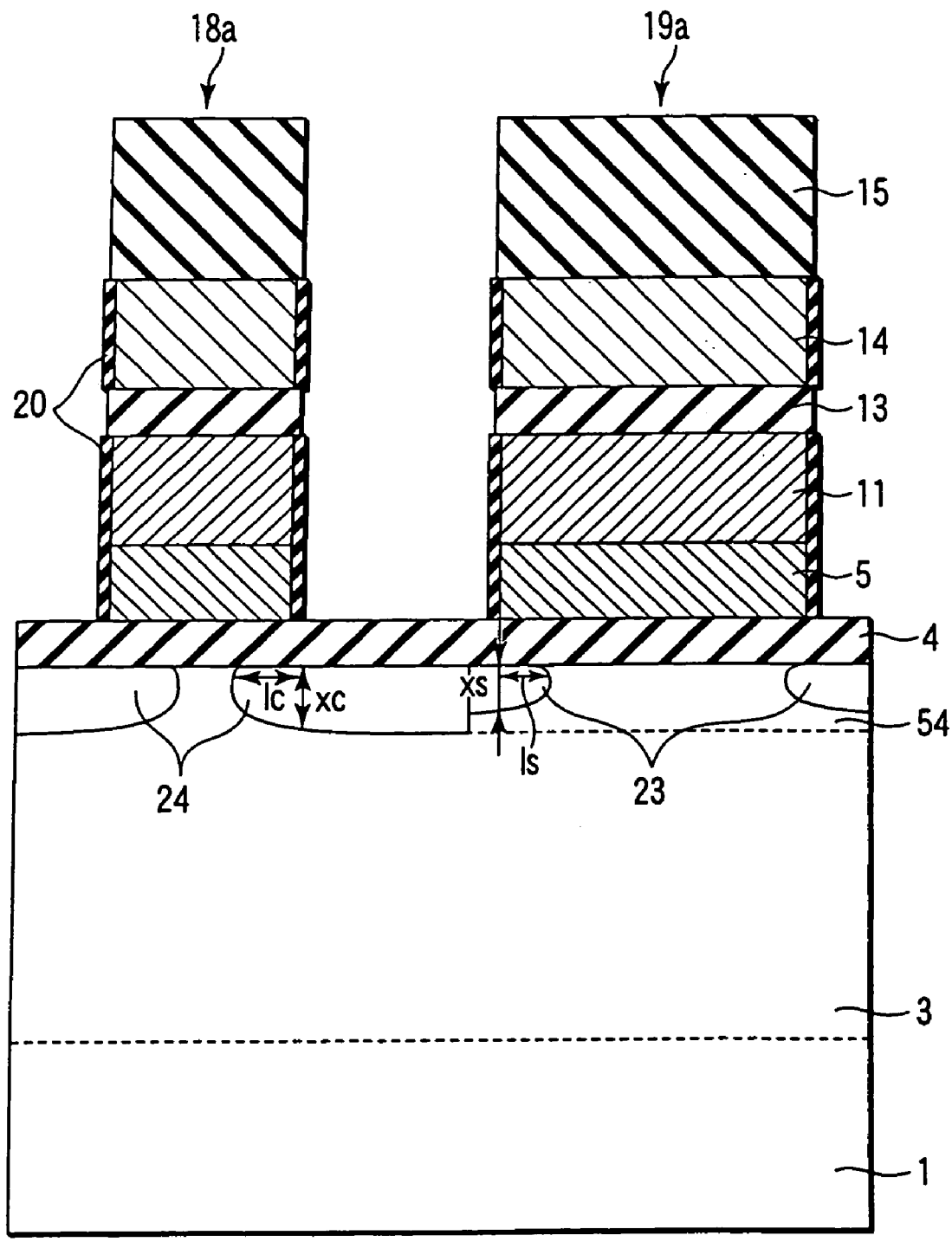
FIG. 38 is an enlarged sectional view showing a portion of the flash memory shown in FIG. 37 including a memory cell transistor and a selection gate transistor.

FIG. 38 shows a sectional view of a device portion including one selection gate transistor and one memory cell adjacent thereto on an enlarged scale.

In the source/drain impurity diffusion regions extending from either the memory cell or the selection gate transistor, the effective impurity concentration (the concentration of impurity obtained by subtracting the concentration of the p-type impurity from the concentration of the n-type impurity) of the source/drain diffusion layer 23 of the selection gate transistor is lower than that of the source/drain diffusion layer 24 of the memory cell, so that the depth of pn-junction in the source and drain diffusion layers 23 of the selection gate transistor is made smaller than that in the diffusion layers 24 of the memory cell.

That is, the depth of diffusion (i.e. depth of junction) of the source/drain diffusion layer 23 of the selection gate transistor is made different from that of the source/drain diffusion layer 24 of the memory cell. At a certain depth from the boundary between the semiconductor substrate or the p-well 3 and the gate insulation film 4, the distance 1s, where the source/drain diffusion layer of the selection gate transistor overlaps the gate electrode thereof, is made smaller than the distance 1c, where the diffusion layer of the memory cell overlaps the gate electrode thereof.

Further, the depth xs of pn-junction under the side ends of the gate electrode of the selection gate transistor in the depth direction of the diffusion layer is made smaller than the depth xc of pn-junction under the side ends of the gate electrode of the memory cell in the depth direction of the diffusion layer of the semiconductor substrate.

Figure 39:
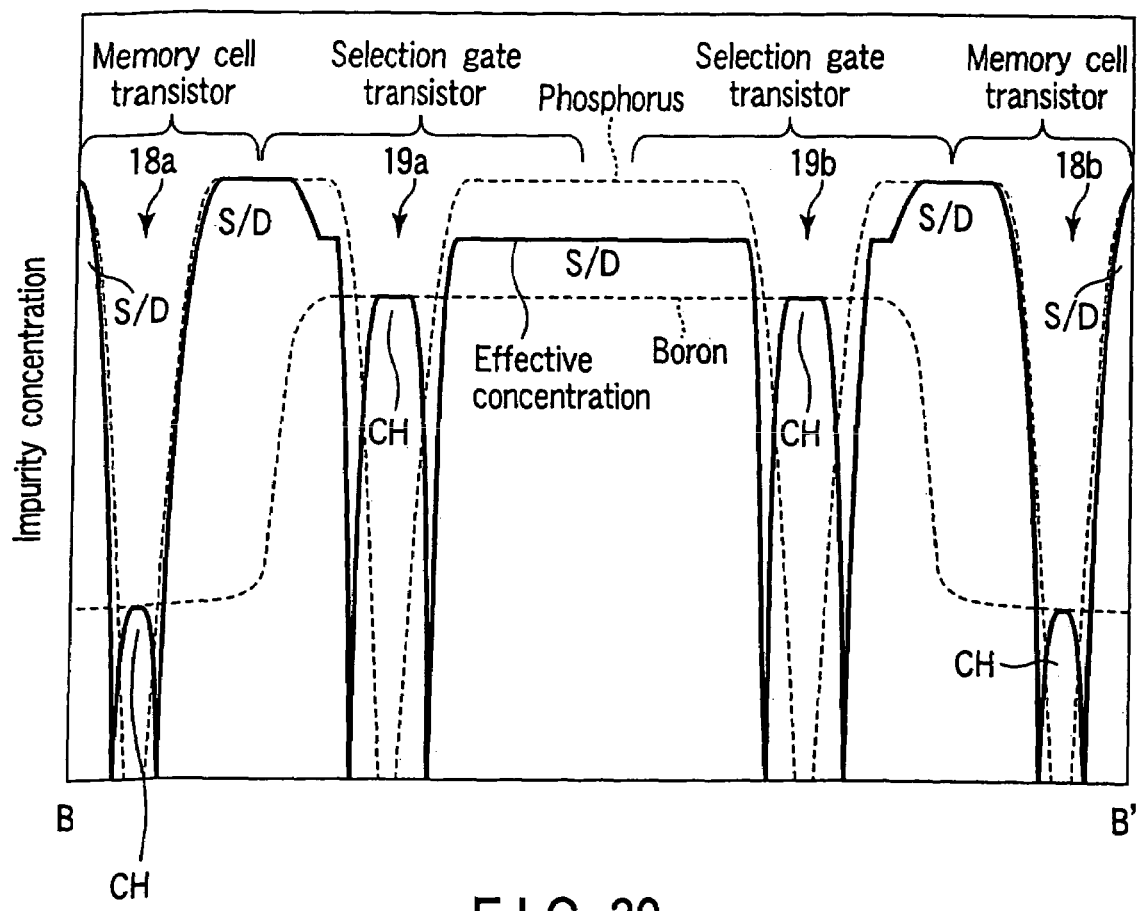
FIG. 39 is a view showing an impurity distribution in the cross-section taken along the line B–B' of FIG. 37.

FIG. 39 shows an impurity concentration distribution in the cross-section taken along the line B–B' of FIG. 37.

As is seen from this impurity concentration distribution, the effective impurity concentration in the channel region CH of the selection gate transistor is higher than the effective impurity concentration in the channel region CH of the memory cell. Besides, the effective impurity concentration in the source S/drain D diffusion layer region of the selection gate transistor is lower than the effective impurity concentration in the source S/drain D diffusion layer region of the memory cell.

FIG. 40 shows an impurity concentration distribution in the channel region of the selection gate transistor in the substrate depth direction along the line C–C' of FIG. 37.

FIG. 41 shows an impurity concentration distribution in the channel region of the memory cell in the substrate depth direction along the line 41D–41D' of FIG. 37.

Generally, as the impurity distribution in a well/channel region is provided as a result of multiple ion implantations and subsequent impurity diffusions through a thermal process, the final impurity distribution thereof is a total combination of the multiple distributions. In this embodiment, an impurity such as phosphorus (P) is introduced into the P-channel region of the selection gate transistor by ion implantation after forming the gate insulation film, a part of the gate electrode (the first polysilicon layer 5), and the element isolation region.

Therefore, the impurity concentration distribution in the channel region of the selection gate transistor in the substrate depth direction shown in FIG. 40 indicates higher impurity concentration near the semiconductor substrate compared with the distribution of the impurity concentrations in the channel region of the memory cell in the substrate depth direction shown in FIG. 41.

Further, the impurity P doped into the channel region of the selection gate transistor by ion implantation is not affected by the previous thermal processes when the gate insulation film and element isolation region were formed, which reduces diffusion of the impurity. Accordingly, as can be seen from a comparison between FIG. 40 and FIG. 41, the peak width WC of the impurity distribution in the vicinity of the gate insulation film of the selection gate transistor is smaller than the peak width D of the impurity distribution in the vicinity of the gate insulation film of the memory cell.

That is, as with this embodiment, the controllability of the impurity distribution can be improved by additional ion implantation into the channel region of the selection gate transistor through a part of the gate electrodes after forming the element isolation region.

As discussed above, additional ion implantation of a p-type impurity into the channel region of the selection gate transistor rises the threshold voltage of the selection gate transistor due to the increase in impurity concentration in the channel region and reduces the short channel effect of the selection gate transistor due to the decrease in pn-junction depth, whereby the cut-off characteristics of the selection gate transistor are improved.

Besides, as the threshold voltage of the selection gate transistor can be controlled regardless of the memory cell, the impurity concentration in the well/channel region 3 can be reduced in the range that the threshold voltage of the select transistor is made higher than that of the memory cell, and thus the impurity concentration in the channel region of the memory cell, whereby resistance to the stress per writing at the time of non-selection can be improved.

Next, as shown in FIG. 42, after an insulation film (not shown) which serves as a barrier to etching is formed on each of the sidewalls of the gate electrodes of the memory cell and selection gate transistor, an interlayer insulation film 25 is deposited and a resist (not shown) is coated thereto. Then, the coated resist is patterned using the photolithography method to form a resist pattern and the interlayer insulation film 25 is etched using the resist pattern to form a contact hole 26 in the interlayer insulation film 25, which extends to the source/drain diffusion layer 23 between the gate electrodes of two selection gate transistors which are located adjacent to each other. After the interlayer insulation film 25 is thus etched, the resist is removed.

After that, if necessary, a region 27 having a higher n-type impurity concentration is formed in the source/drain diffusion layer 23 between the gate electrodes of the adjacent selection gate transistors by supplying an n-type impurity through the contact hole 26 for ion implantation doping of the semiconductor substrate. When such a region 27 having a higher n-type impurity concentration is formed, it goes without saying that the n-type impurity concentration and effective impurity concentration between the selection gate transistors in FIG. 39 increase.

Subsequently, a conductor is formed within the contact hole 26, an interconnecting layer is formed according to a well known method, and then a protection film is deposited thereon, whereby a NAND type flash memory is completed.

According to this embodiment, an open pattern is prepared for a channel region 54 of a selection gate transistor so as not to expose a channel region of a memory cell. Therefore, as shown in FIG. 43, the larger the distance L1 between the gate electrode of the selection gate transistor and the gate electrode of the memory cell than the distance L2 between the gate electrodes of the memory cells, the easier a hole extending to the channel region 54 of the selection gate transistor being made. However, the relationship between L1 and L2 is not limited to L1>L2, but may be L1=L2 or L1<L2.

While the description of the embodiment discusses that the element isolation region is formed after forming the well/channel region 3 and gate insulation film 4, the well/channel region 3 and gate insulation film 4 may be formed after forming the element isolation region.

Further, in this embodiment, the source and drain diffusion layers of the memory cells and those of the selection gate transistors may be arranged as an LDD (lightly doped drain) structure which is achieved by forming sidewall oxide films (not shown) on the gate electrode sidewalls of the memory cells and selection gate transistors using a known method, and by ion-implanting a high concentration n-type impurity therein.

(Sixth Embodiment)

In the description of a sixth embodiment of the present invention, a case where the resist mask for ion implantation to the channel region of the select transistor used in the foregoing fifth embodiment is misaligned to the position intended to form the gate electrode of the select transistor, and a p-type impurity is not doped into a part of the channel region of the selection gate transistor is described with reference to FIG. 44 and FIG. 45. The same reference numerals as used in FIG. 37 are used to denote the same components in FIG. 44.

First, as in the fifth embodiment, the steps illustrated in FIG. 28 to FIG. 33 are performed.

Figure 44:
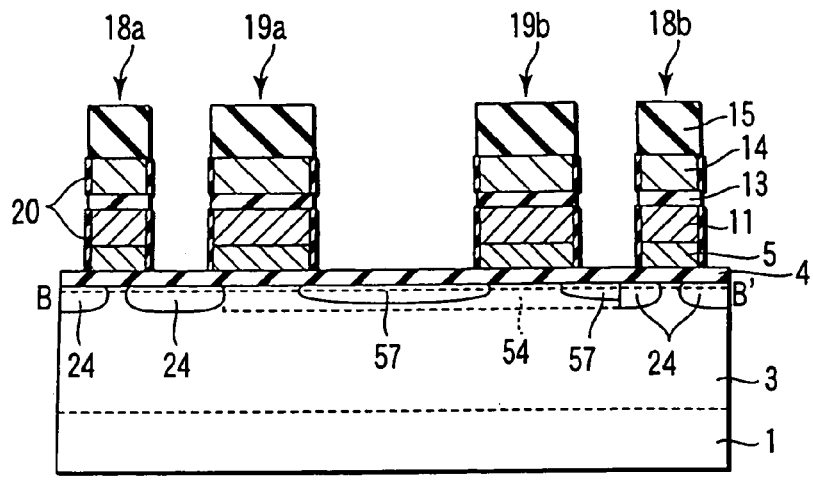
FIG. 44 is a sectional view showing a manufacturing step a NAND type flash memory having a two-layer gate structure according to a sixth embodiment of the present invention.

Next, a resist mask is prepared, and a p-type impurity is doped in the channel region at a part corresponding to the selection gate transistor by ion implantation, whereby a region 54 having a higher impurity concentration than that of the memory cell is formed (see FIG. 44). Then, gate electrodes are formed as in the fifth embodiment (see FIG. 44).

At this time, if the resist mask is misaligned to the position intended to form a gate electrode of the selection gate transistor thereon, the aforementioned region 54 having a higher impurity concentration is not formed in the part of the channel region of the selection gate transistor 19*a* near the memory cell as shown in FIG. 44 but remains with the same impurity concentration as that of the memory cell.

On the other hand, a part of the channel region of the selection gate transistor on the side of a bit line or source line contact is formed with the higher impurity concentration region 54 than that of the well channel layer 3. Therefore, the effective impurity concentration (the concentration of impurity obtained by subtracting the concentration of the p-type impurity from the concentration of the n-type impurity) in the diffusion layer 57 of the selection gate transistor 19*a* on the contact side of the bit line or source line and the effective impurity concentration in the diffusion layer 57 of the selection gate transistor 19*b* is made smaller than the effective impurity concentration in the diffusion layer 24 of the memory cell.

Further the junction depths in the diffusion layer 57 on the contact side of the bit line or source line of the selection gate transistor 19*a* and in the diffusion layer 57 of the selection gate transistor 19*b* is made smaller than the junction depth in the diffusion layer of the memory cell as in the fifth embodiment.

Figure 45:
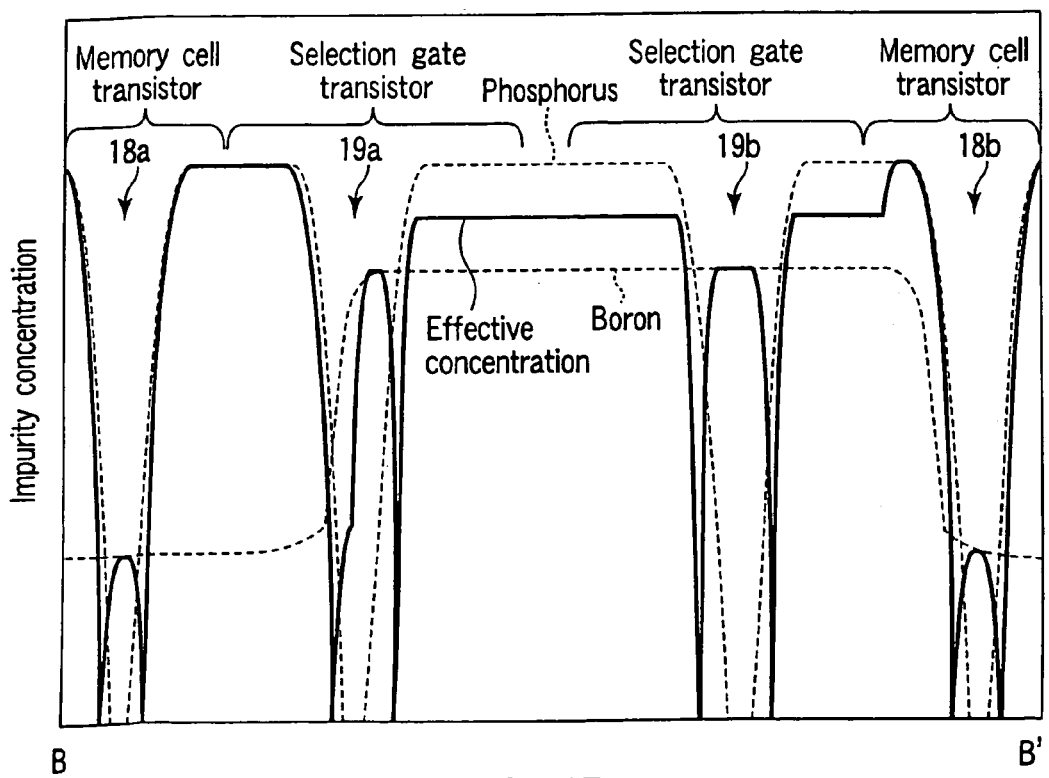
FIG. 45 is a view showing the impurity distribution in the cross-section taken along the line B–B' of FIG. 44.

FIG. 45 shows an impurity concentration distribution in the cross-section taken along the line B–B' of FIG. 44.

In this impurity concentration distribution, a part of the channel region of the selection gate transistor 19*a* and the entire channel region of the select transistor 19*b* have higher effective impurity concentrations than the effective impurity concentration in the channel region of the memory cell.

Besides, the effective impurity concentration in the source/drain diffusion layer regions of the selection gate transistors is lower than the effective impurity concentration in the source/drain diffusion layer regions of the memory cells. Therefore, the threshold voltage of the selection gate transistors rises due to the increase in impurity concentration in the channel region and the short channel effect of the selection gate transistors reduces due to the decrease in pn-junction depth, whereby the cut-off characteristics of the selection gate transistors are improved.

As is mentioned above, as long as the misalignment of the resist mask 53 (FIG. 34) is limited such that the selection gate transistor 19*a* satisfies the desired cut-off characteristics, the selection gate transistor can be controlled regardless of the memory cell within the range that the threshold voltage of the select transistor is made higher than that of the memory cell. Thus, it becomes possible to reduce the impurity concentration in the well/channel region 3 and the impurity concentration in the channel region of the memory cell, whereby resistance to the stress per writing at the time of non-selection can be improved.

After that, by performing the similar steps as mentioned in the description of fifth Embodiment, a NAND type flash memory is completed. In this case, it goes without saying that the n-type impurity concentration and effective impurity concentration between the selection gate transistors shown in FIG. 45 are increased when the semiconductor substrate is doped with an n-type impurity through the contact hole 26 by ion implantation as shown FIG. 42 and a region having a higher n-type impurity concentration is formed within the semiconductor substrate between the gate transistors.

While the description of this embodiment discusses that the element isolation region is formed after forming the well/channel region 3 and gate insulation film 4, the well/channel region 3 and gate insulation film 4 may be formed after forming the element isolation region.

Further, in this embodiment, the source/drain diffusion layers of the memory cells and those of the selection gate transistors may be arranged as an LDD structure which is achieved by forming sidewall oxide films (not shown) on the gate electrode sidewalls of the memory cells and selection gate transistors using a known method and by ion-implanting a high concentration n-type impurity thereinto.

(Seventh Embodiment)

In the description of the sixth embodiment, such a structure that one of the two opposite selection gate transistors which interpose a bit line or source line contact portion therebetween can not be additionally doped with a p-type impurity except a part of the channel region thereof was described. However, if desired cut-off characteristics are satisfied, the other selection gate transistor does not necessarily need to be doped with its entire channel region but a part thereof.

In the description of the seventh embodiment, a case where ion implantation is performed for only a part of each channel region of the two selection gate transistors which are oppositely disposed with a contact portion interposed therebetween is described with reference to FIG. 46 and FIG. 47. In FIG. 46, similar reference numerals are used to denote similar parts to those in FIG. 37.

First, as in the fifth embodiment, the steps illustrated in FIG. 28 to FIG. 33 are performed.

Next, a resist mask is prepared, and an area in the channel region corresponding to the selection gate transistor is doped with a p-type impurity by ion implantation, whereby a region 54 having a higher impurity concentration than that of the memory cell is formed (see FIG. 46). Then, gate electrodes are formed as in the fifth embodiment (see FIG. 46).

At this time, if a p-type impurity is doped into a substrate area smaller than the area intended to form a channel region of a selection gate transistor, such a region 54 that has a higher impurity concentration than that of the memory cell is not formed near the memory cell in the respective regions of the selection gate transistors 19*a* and 19*b* and this area remains with the same impurity concentration as that of the memory cell.

On the other hand, a part of the channel region of the selection gate transistor on the contact side of a bit line or source line is formed with a higher impurity concentration region 54 than that of the well channel layer 3. Therefore, the effective impurity concentration (the concentration of impurity obtained by subtracting the concentration of the p-type impurity from the concentration of the n-type impurity) in a diffusion layer 58 on the contact side of the bit line or source line of each selection gate transistors 19a and 19b is made smaller than the effective impurity concentration in the diffusion layer 24 of the memory cell.

Further, the junction depths in the diffusion layer 58 on the bit line contact side or source line contact side of the selection gate transistors 19a and 19b is made smaller than the junction depth in the diffusion layer of the memory cell as mentioned in the description of fifth Embodiment.

FIG. 47 shows an impurity concentration distribution in the cross-section taken along the line B–B' of FIG. 46.

In this impurity concentration distribution, the effective impurity concentration in a part of the respective channel region of each of the selection gate transistors 19a and 19b is higher than the effective impurity concentration in the channel region of the memory cell. Besides, the effective impurity concentration in the source/drain diffusion layer region of the selection gate transistor is lower than the effective impurity concentration in the source/drain diffusion layer region of the memory cell. Therefore, the threshold voltage of the selection gate transistors rises due to the increase in impurity concentration in the channel region and the short channel effect of the selection gate transistors reduces due to the decrease in pn-junction depth, whereby the cut-off characteristics of the selection gate transistors are improved.

As is mentioned above, as long as the misalignment of the resist mask for additional ion implantation to the region intended for a channel region of the selection gate transistor is limited such that the selection gate transistors 19a and 19b satisfy the desired cut-off characteristics, the selection gate transistor can be controlled regardless of the memory cell within the range that the threshold voltage of the select transistor is made higher than that of the memory cell.

Thus, it becomes possible to reduce the impurity concentration in the well/channel region 3 and the impurity concentration in the channel region of the memory cell, whereby resistance to the stress per writing at the time of non-selection can be improved.

After that, by performing the similar steps as mentioned in the description of fifth Embodiment, a NAND type flash memory is completed. At this time, it goes without saying that the n-type impurity concentration and effective impurity concentration between the selection gate transistors shown in FIG. 47 become higher when the semiconductor substrate is doped with an n-type impurity through the contact hole 26 by ion implantation as shown FIG. 42 and a region having a higher n-type impurity concentration is formed just below the contact.

While in this embodiment the element isolation regions are formed after forming the well/channel region 3 and gate insulation film 4, the well/channel region 3 and gate insulation film 4 can be formed after forming the element isolation regions.

Further, in this embodiment, the source/drain diffusion layers of the memory cells and those of the selection gate transistors may be arranged as an LDD structure which is achieved by forming sidewalls (not shown) on the gate electrodes of the memory cells and selection gate transistors using a known method and by ion-implanting a high concentration n-type impurity therein.

(Eighth Embodiment)

An eighth embodiment of the present invention describes a NAND type flash memory having such a structure that the element isolation characteristics of a transistor constituting the peripheral circuit of a memory cell array is improved and that the cut-off characteristics of selection gate transistors is improved and also describes a method of manufacturing the same.

In the eighth embodiment, after the formation of the channel regions of a memory cell and selection gate transistors and the formation of element isolation regions, a mask is formed to pattern the channel regions of the selection gate transistors and to pattern the element isolation region of a transistor constituting a peripheral circuit, and then an impurity is ion-implanted through a part of gate electrodes to a depth near to the element isolation regions and to a depth near to the gate insulation film of an activation region.

In this embodiment, a high breakdown-voltage transistor formed on a semiconductor substrate is exemplified as the transistor of the peripheral circuit with reference to FIGS. 48 to 52. In these figures, a left half portion shows the high breakdown-voltage transistor and a right half portion shows a memory cell region.

Figure 48:
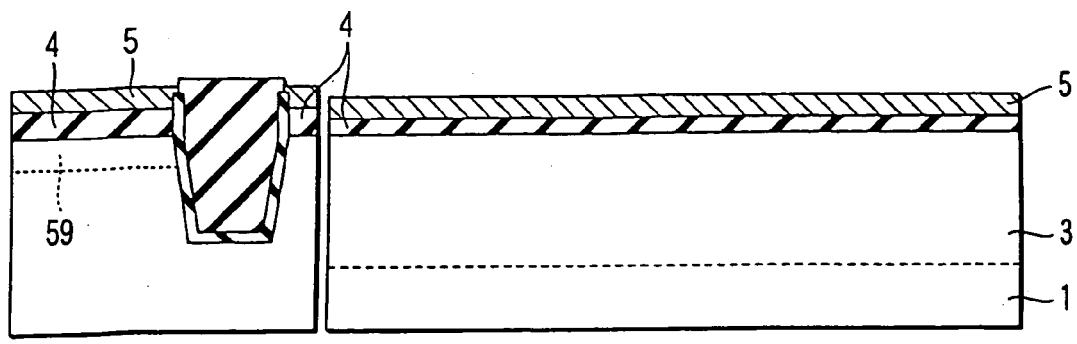
FIG. 48 is a sectional view showing a manufacturing step of a NAND type flash memory having a two-layer gate structure according to an eighth embodiment of the present invention.

First, as shown in FIG. 48, the well/channel region 3 of the memory cell region and a channel region 59 of the high breakdown-voltage transistor are formed, and then the element isolation region is formed.

Figure 49:
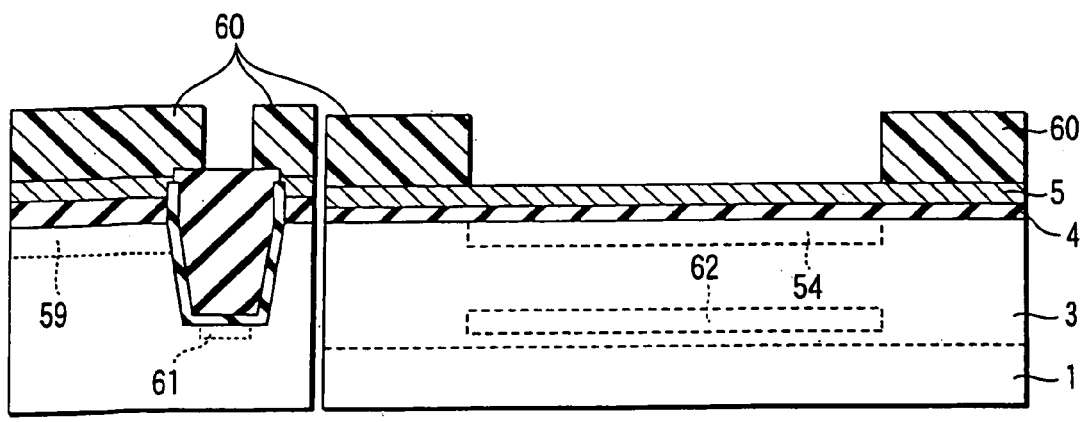
FIG. 49 is a sectional view showing a manufacturing step following the manufacturing step of FIG. 48.

Next, as shown in FIG. 49, a resist is coated and the coated resist is patterned using photolithography, to thereby form a resist mask 60 having apertures to the portions thereof corresponding to the element isolation region of the high breakdown-voltage transistor and to the channel regions of the selection gate transistors. At this time, the aperture of the memory cell region of the resist mask 60 is set within such a range that the selection gate transistors satisfy desired cut-off characteristics and no aperture is formed in the channel regions of the memory cells even if misalignment arises, as described in the above respective embodiments.

Then, a P-type impurity (for example, boron (B)), is ion implanted to the depth of the element isolation region and to the depth near to the gate insulation film of the activation region, and a higher impurity concentration region 61, which prevents inversion just under the element isolation region of the high breakdown-voltage transistor, and the channel regions 54 of the selection gate transistors, which have a higher impurity concentration than that of the memory cell, are formed. At this time, a region 62, which has the same impurity concentration as that of the inversion preventing high impurity concentration region 61, is also formed in the activation region of the selection gate transistors to a depth near to the element isolation region.

Figure 50:
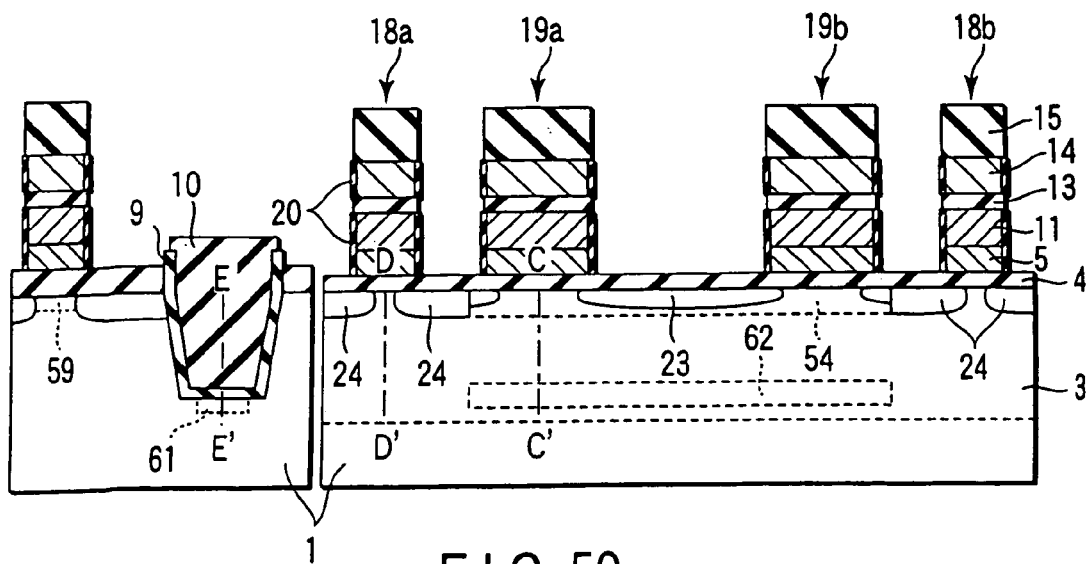
FIG. 50 is a sectional view showing a manufacturing step following the manufacturing step of FIG. 49.

Next, as shown in FIG. 50, gate electrodes and source/drain diffusion layers are formed similarly to the fifth embodiment of the present invention. As a result, the shapes of the source/drain diffusion layers of the selection gate transistors and the impurity distribution of the channel regions thereof are made similar to those of the respective embodiments described above. Same reference numerals as used in FIG. 37 are used to denote the same components in FIG. 50.

The concentration distribution of impurity in the channel region of the memory cell along the line D—D in FIG. 50 is the same as that of the aforementioned fifth embodiment shown in FIG. 41. Generally, as the impurity distribution in a well/channel region is provided as a result of multiple ion implantations and subsequent impurity diffusions through a thermal process, the final impurity distribution thereof is a total combination of the multiple distributions.

Figure 51:
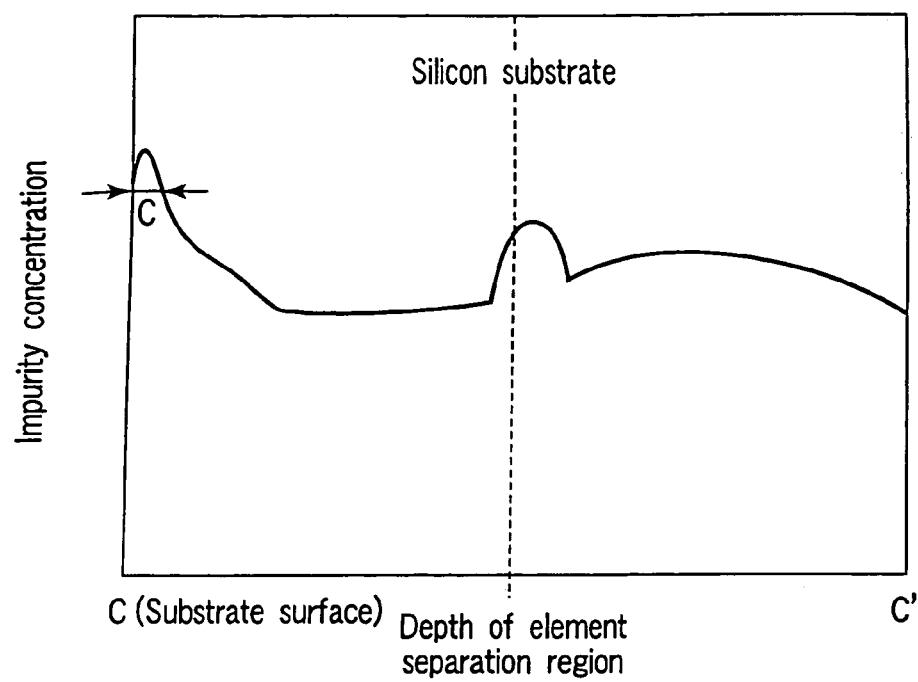
FIG. 51 is a view showing an impurity distribution in the cross-section taken along the line C–C' of FIG. 50.

FIG. 51 shows a concentration distribution of impurity in the channel region of the selection gate transistor along the line C–C' of FIG. 50 in a substrate depth direction.

Figure 52:
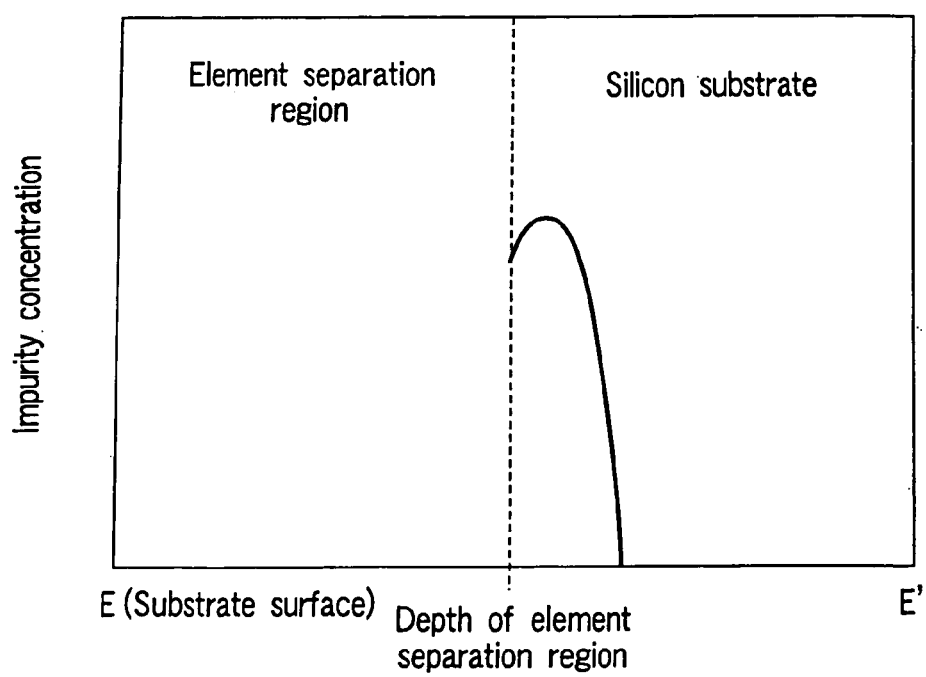
FIG. 52 is a view showing an impurity distribution in the cross-section taken along the line E–E' of FIG. 50.

FIG. 52 shows a concentration distribution of impurity in the element isolation regions 9 and 10 of the high breakdown-voltage transistor along the line E–E' of FIG. 50 in the substrate depth direction.

That is, after the gate insulation film, a part of the gate electrodes, and the element isolation regions are formed, the impurity is ion-implanted in the channel regions of the selection gate transistors similarly to the fifth embodiment of the present invention. Thus, the impurity is diffused in a small amount because it is not affected by the thermal process that is performed when the gate insulation film and the element isolation regions are formed.

Accordingly, the concentration distribution of impurity in the channel regions of the selection gate transistors in the substrate depth direction shown in FIG. 51 has a higher impurity concentration in the vicinity of the gate insulation film and in the vicinity of the semiconductor substrate as compared with the concentration distribution of impurity in the channel regions of the selection gate transistors in the substrate depth direction shown in FIG. 41, thereby the distribution width C of the impurity distribution is narrowed.

Further, since the impurity is additionally ion-implanted in the selection gate transistors through a part of the gate electrodes after the element isolation regions is formed, the controllability of the impurity distribution can be improved.

Further, in this embodiment, the impurity, which is doped just under the element isolation region of the high breakdown-voltage transistor, is also doped in the activation regions of the selection gate transistors. Thus, an impurity distribution, which is similar to that in the element isolation region of the high breakdown-voltage transistor, is formed in the depth of the element isolation regions of the selection gate transistors as shown in FIG. 51.

As described above, the cut-off characteristics of the selection gate transistors are improved by of the additional ion-implantation of the p-type impurity in the channel regions of the selection gate transistors. This improvement is achieved by an increase in the threshold voltage of the selection gate transistors, which is caused by an increase in the impurity concentration in the well/channel region 3, and by the improvement of the short channel effect of the selection gate transistors due to a decrease in the pn junction depth.

Further, the selection gate transistors can be controlled independently of the memory cells in a range in which the threshold voltage of the selection gate transistors can be set higher than that of the memory cell. As a result, the impurity concentration of the well/channel region 3 can be reduced as well as the impurity concentration of the channel regions of the memory cells can be reduced, thereby resistance to the stress per wiring at the time of non-selection can be improved.

Furthermore, a photolithography step can be omitted, and thus a manufacturing cost can be reduced because the additional ion implantation is performed using the mask used when the impurity is ion-implanted in the inversion preventing high impurity concentration region in the element isolation region of the transistor that constitutes the peripheral circuit.

Thereafter, a NAND type flash memory is completed by performing the same steps as those described in the fifth embodiment of the present invention.

Note that while the element isolation regions are formed after the well/channel region 3 and the gate insulation film 4 are formed, the well/channel region 3 and the gate insulation film 4 may be formed after the element isolation regions are formed.

Further, in this embodiment, the source/drain diffusion layers of the memory cell and the selection gate transistors may be arranged as an LDD structure which is achieved by forming sidewalls (not shown) on the gate electrodes of the memory cells and selection gate transistors using a known method, and by ion-implanting a high concentration n-type impurity therein.

(Ninth Embodiment)

The above respective embodiments exemplify that the impurity is additionally ion-implanted in the selection gate transistors after the impurity is ion-implanted to form the well/channel region 3 of the memory cell unit and after the gate insulation film is formed.

In a ninth embodiment, there is described a structure of selection gate transistors in a NAND type flash memory having a two-layer gate structure and a method of manufacturing the same with reference to FIGS. 53 to 56. In this structure, the cut-off characteristics of the selection gate transistors is improved by additionally ion-implanting an impurity in the selection gate transistors just after the ion-implantation of an impurity for forming the well/channel region 3 of a memory cell unit (before a gate insulation film is formed). Note that, the same reference numerals as used in FIG. 37 are used to denote the same components in these figures.

Figure 53:
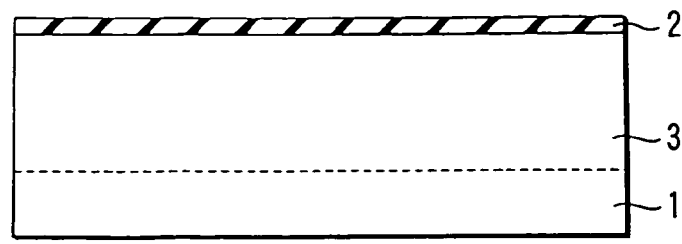
FIG. 53 is a sectional view showing a manufacturing step of a NAND type flash memory having a two-layer gate structure according to a ninth embodiment of the present invention.

First, a buffer oxide film 2 is formed on the surface of a p-type silicon substrate 1 as shown in FIG. 53. Then, a resist (not shown) is coated thereon, the resultant resist layer is patterned to form wells and channels using photolithography, and a well/channel region is formed similarly to the fifth embodiment of the present invention.

Figure 54:
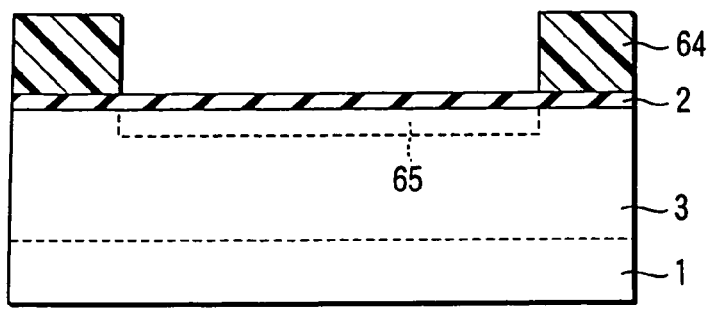
FIG. 54 is a sectional view showing a manufacturing step following the manufacturing step of FIG. 53.

Thereafter, as shown in FIG. 54, a resist is coated, and the resultant resist mask is patterned to form the channel regions of the selection gate transistors using photolithography. Then, a p-type impurity (for example, boron (B)) is ion-implanted and a region 65 having a higher impurity concentration than that of memory cells is formed. At this time, an aperture of a memory cell region of a resist mask 64 is set within such a range that the selection gate transistors satisfy desired cut-off characteristics and no aperture is formed in the channel regions of the memory cells even if misalignment arises, as described in the above fifth, sixth and seventh embodiments.

Figure 55:
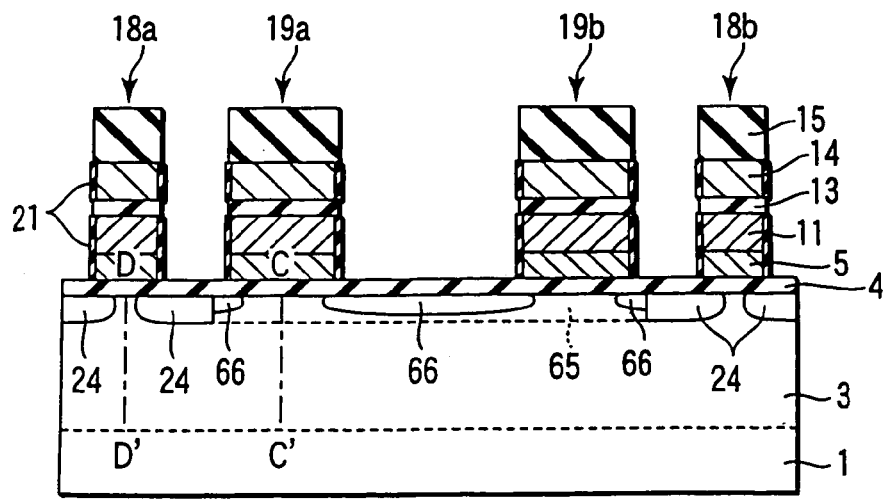
FIG. 55 is a sectional view showing a manufacturing step following the manufacturing step of FIG. 54.
Figure 57:
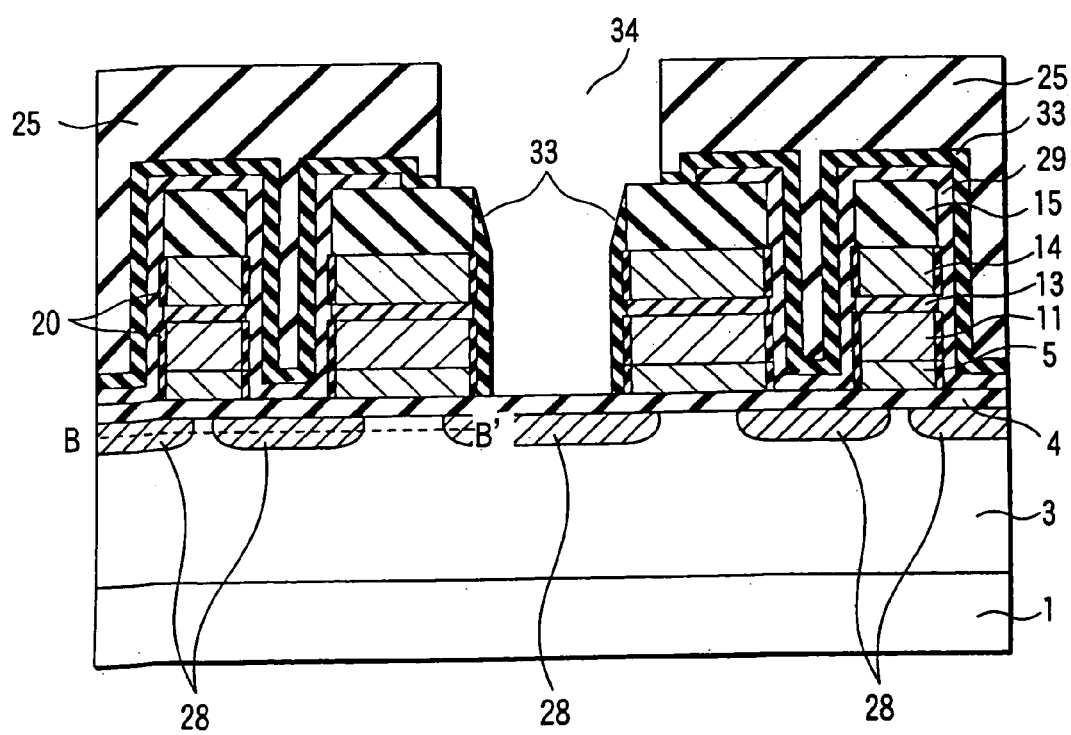
FIG. 57 is a sectional view of a conventional non-volatile semiconductor memory device.
Figure 58:
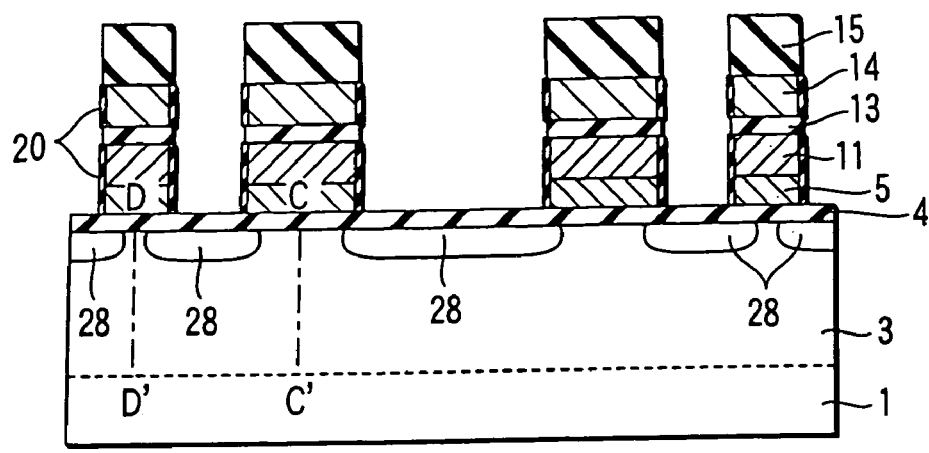
FIG. 58 is a view showing structures of memory cells and selection gate transistors of a conventional NAND type flash memory in cross-section along the gate length thereof.
Figure 59:
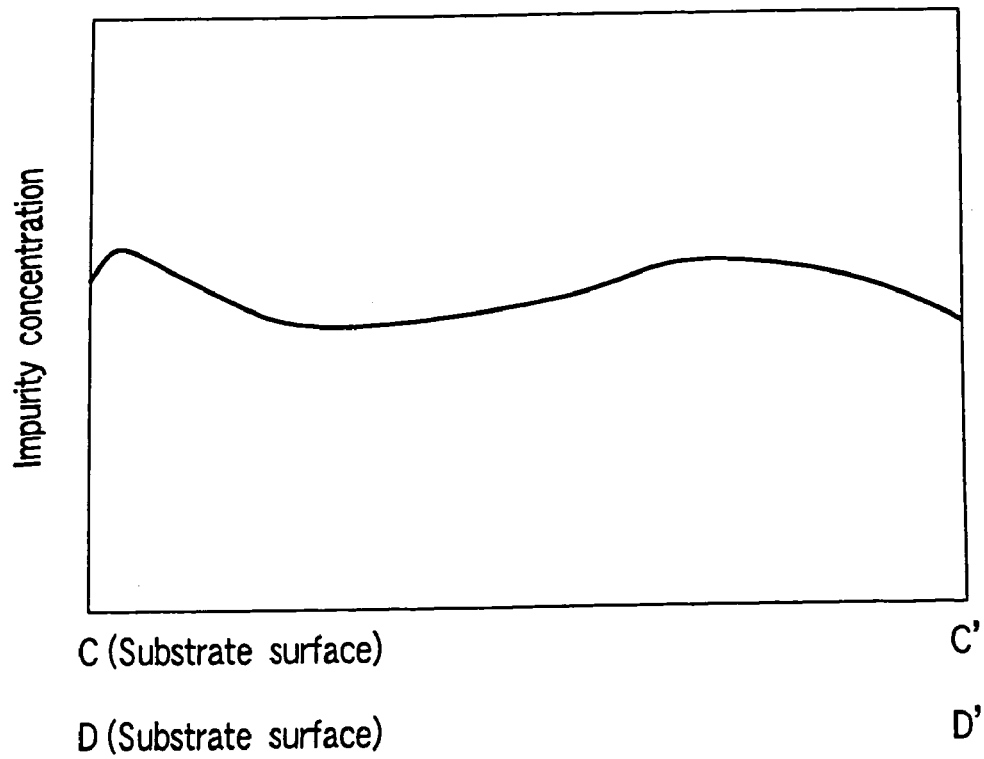
FIG. 59 is a view showing an impurity distributions in the cross-sections taken along the lines C–C' and D–D' of FIG. 58.

Thereafter, similarly to the fifth embodiment, element isolation regions are formed, gate electrodes are formed, and source/drain diffusion layers 66, and the like of the selection gate transistors are formed, as shown in FIG. 55.

In FIG. 56, the concentration distribution of impurity in the channel region of the selection gate transistor along the line C–C' of FIG. 55 in a substrate thickness direction is shown by a solid line, and the concentration distribution of impurity in the channel region of the memory cell along the line D–D' of FIG. 55 in the substrate depth direction is shown by a dotted line.

Generally, as the impurity distribution in the well/channel region 3 is provided as a result of multiple ion implantations and subsequent impurity diffusions through a thermal process, the final impurity distribution thereof is a total combination of the multiple distributions.

In this embodiment, since the impurity is ion-implanted in the channel regions of the selection gate transistors simultaneously with the ion-implantation of the impurity in the memory cells, the selection gate transistors and the memory cells are subjected to the same thermal process. Thus, the impurity concentration of the channel regions of the selection gate transistors in the vicinity of the gate insulation film thereof and in the semiconductor substrate thereof is higher than that of the channel regions of the memory cells in the vicinity of the gate insulation film thereof and in the semiconductor substrate thereof. However, both the impurities of the selection gate transistors and the memory cells have the same distribution shape.

Further, the impurity concentration of the impurity that is additionally ion-implanted in the channel regions of the selection gate transistors is lower than that of the fifth to seventh embodiments, and the junction depth of the source/drain diffusion layers of the selection gate transistors becomes deeper. However, the shape of the source/drain diffusion layers of the selection gate transistors and the impurity distribution of the channel regions thereof are qualitatively similar to those described in the fifth to seventh embodiments.

As described above, the cut-off characteristics of the selection gate transistors are improved by the additional ion-implantation of the p-type impurity in the channel regions of the selection gate transistors. This improvement is achieved by an increase in the threshold voltage of the selection gate transistors, which is caused by an increase in the impurity concentration in the channel regions, and by the improvement of the short channel effect of the selection gate transistors due to a decrease in the pn junction depth.

Further, the selection gate transistor can be controlled independently of the memory cell in a range in which the threshold voltage of the selection gate transistors can be set higher than that of the memory cells. As a result, the impurity concentration of the well/channel region 3 can be reduced as well as the impurity concentration of the channel regions of the memory cells can be reduced, thereby resistance to the stress per wiring at that time of non-selection can be improved.

Thereafter, the NAND type flash memory is completed by performing the same steps as those described in the fifth embodiment of the present invention.

Note that the element isolation regions are formed after the impurity is ion-implanted in the well/channel region 3 of the memory cell unit and in the channel regions of the selection gate transistors as well as after the gate insulation film 4 is formed in this embodiment. However, the impurity may be ion-implanted in the well/channel region 3 of the memory cell unit and in the channel regions of the selection gate transistors after the formation of the element isolation regions.

Further, in this embodiment, the source/drain diffusion layers of the memory cells and those of the selection gate transistors may be arranged as an LDD structure by forming sidewalls (not shown) on the gate electrodes using a know method and by ion-implanting an n-type impurity having a higher impurity concentration.

As described above, in each of the embodiments, there can be provided the flash memory, which can excellently realize the various characteristics of the memory cell transistor such as data writing characteristics, data maintaining characteristics, resistance against read stress as well as the cut-off characteristics of the selection gate transistor, and the method of manufacturing the flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device, comprising:
   a plurality of memory cell units comprising at least one memory cell having a laminated gate structure of a charge accumulation layer and a control gate layer formed on a semiconductor substrate through a gate insulation film; and
   a plurality of selection gate transistors each having a gate electrode formed through a gate insulation film that is formed simultaneously with the gate insulation film of the memory cell and is substantially the same therewith and a source/drain diffusion layer one of which is connected to each memory cell unit and the other of which is electrically connected to a bit line or a source line,
   wherein the plurality of selection gate transistors have a pair of selection gate transistors disposed in confrontation with each other across a contact portion connected to the bit line or to the source line; and
   the pair of selection gate transistors have substantially the same structure, each of the pair of transistors has a portion in which the impurity concentration of the channel region thereof is different in a gate length direction at a depth equal from the boundary between the semiconductor substrate and the gate insulation film, and the concentration distribution of impurity of the channel region of each transistor is different from that of the channel region of the memory cell.

2. A non-volatile semiconductor memory device according to claim 1, wherein the impurity concentration of the portion of the channel region of each selection gate transistor on one of the bit line contact portion side thereof and the source line contact portion side thereof is made higher than the impurity concentration of the channel region of the memory cell at the above depth from the boundary between the semiconductor substrate and the gate insulation film.

3. A non-volatile semiconductor memory device according to claim 1, wherein the impurity distribution width of the portion of the channel region of each selection gate transistor on one of the bit line contact portion side therof and the source line contact portion side thereof is made smaller than the impurity distribution width of the channel region of the memory cell at the above depth from the boundary between the semiconductor substrate and the gate insulation film.

4. A non-volatile semiconductor memory device, comprising:
   a plurality of memory cell units comprising at least one memory cell formed on a semiconductor substrate through a gate insulation film and having a laminated gate structure of a charge accumulation layer and a control gate layer; and
   a plurality of selection gate transistors each having a gate electrode formed through a gate insulation film that is formed simultaneously with the gate insulation film of the memory cell and is substantially the same therewith and a source/drain diffusion layer one of which is connected to each memory cell unit and the other of which is electrically connected to a bit line or a source line, wherein the plurality of selection gate transistors have a pair of selection gate transistors disposed in confrontation with each other across a contact portion connected to the bit line or to the source line and having substantially the same structure; and the impurity concentration of the source diffusion layer of each of the pair of selection gate transistors is different from that of the drain diffusion layer thereof at a depth equal from the boundary between the semiconductor substrate and the gate insulation film as well as the effective impurity concentration of the source diffusion layer or the drain diffusion layer, which is connected to the bit line or the source line, of each selection gate transistor is lower than that the source/drain diffusion layer of the memory cell.

5. A non-volatile semiconductor memory device according to claim 4, wherein the distance, where the source/drain diffusion layer, which is connected to the bit line or to the source line, of each selection gate transistor overlaps the gate electrode thereof, is made smaller than the distance, where the source/drain diffusion layer of the memory cell overlaps the gate electrode thereof at the above depth from the boundary between the semiconductor substrate and the gate insulation film.

6. A non-volatile semiconductor memory device according to claim 4, wherein the junction depth of the source/drain diffusion layer, which is connected to the bit line or to the source line, of each selection gate transistor from the boundary between the semiconductor substrate and the gate insulation film is made smaller than that of the source/drain diffusion layer of the memory cell from the boundary between the semiconductor substrate and the gate insulation film.

* * * * *